(12) United States Patent
Sakamoto

(10) Patent No.: US 11,695,292 B2
(45) Date of Patent: Jul. 4, 2023

(54) POWER SUPPLY SYSTEM FOR MOBILE BODY

(71) Applicant: HONDA MOTOR CO., LTD., Tokyo (JP)

(72) Inventor: Hiroki Sakamoto, Tokyo (JP)

(*) Notice: Subject to any disclaimer, the term of this patent is extended or adjusted under 35 U.S.C. 154(b) by 0 days.

(21) Appl. No.: 17/678,027

(22) Filed: Feb. 23, 2022

(65) Prior Publication Data

US 2022/0302730 A1    Sep. 22, 2022

(30) Foreign Application Priority Data

Mar. 19, 2021  (JP) ................. 2021-046218

(51) Int. Cl.
*H02J 7/00*   (2006.01)
*G01K 3/08*   (2006.01)
(Continued)

(52) U.S. Cl.
CPC .......... *H02J 7/00712* (2020.01); *B60L 53/20* (2019.02); *B60L 58/18* (2019.02); *B60L 58/20* (2019.02); *B60L 58/26* (2019.02); *G01K 3/08* (2013.01); *G01R 31/382* (2019.01); *H02J 7/0031* (2013.01); *H02J 7/0048* (2020.01); *H02J 7/0063* (2013.01); *B60L 2240/545* (2013.01); *H02J 2207/20* (2020.01)

(58) Field of Classification Search
CPC .... B60L 53/20; B60L 58/10; B60L 58/12–15; B60L 58/18; B60L 58/20; B60L 58/24; B60L 58/26; B60L 2240/545–549; G01K 3/08; G01R 31/382; H02J 7/00309; H02J 7/0031; H02J 7/0048; H02J 7/0063; H02J 7/00712; H02J 7/342; H02J 2207/20
See application file for complete search history.

(56) References Cited

U.S. PATENT DOCUMENTS

2009/0179616 A1* 7/2009 Ichikawa ............ H02J 7/1423
                                                320/134
2016/0301114 A1* 10/2016 Izumi ................. H01M 10/625
(Continued)

FOREIGN PATENT DOCUMENTS

JP        2017169311 A    9/2017

*Primary Examiner* — Levi Gannon
(74) *Attorney, Agent, or Firm* — CKC & Partners Co., LLC

(57) ABSTRACT

A power supply system includes: a voltage converter that converts a voltage between first and second power circuits; a power controller that controls charging and discharging of first and second batteries; a cooling output controller that controls cooling output for the second battery; a temperature remaining-capacity acquirer that acquires a temperature remaining-capacity T2_mar; and a cooling remaining-capacity acquirer that acquires a cooling remaining-capacity PC2_mar depending on a difference between maximum cooling output and the cooling output of the second cooler. The power controller is configured to stop the voltage converter in a case where at least one of the temperature remaining-capacity T2_mar and the cooling remaining-capacity PC2_mar is less than an associated one of a threshold value for the temperature remaining-capacity and a threshold value for the cooling remaining-capacity and a potential difference between the first and second batteries is equal to or more than a potential difference threshold value.

16 Claims, 10 Drawing Sheets

(51) Int. Cl.
    *B60L 53/20*     (2019.01)
    *B60L 58/26*     (2019.01)
    *B60L 58/18*     (2019.01)
    *G01R 31/382*     (2019.01)
    *B60L 58/20*     (2019.01)

(56) References Cited

U.S. PATENT DOCUMENTS

| | | | | |
|---|---|---|---|---|
| 2017/0305292 | A1* | 10/2017 | Minamiura | B60L 58/20 |
| 2018/0312077 | A1* | 11/2018 | Kondo | B60R 16/033 |
| 2019/0299807 | A1* | 10/2019 | Oyama | B60K 23/08 |
| 2019/0381898 | A1* | 12/2019 | Kobayashi | B60L 58/20 |

\* cited by examiner

FIG. 7

| | | WITH COOLING REMAINING-CAPACITY | NO COOLING REMAINING-CAPACITY | WITH COOLING REMAINING-CAPACITY | NO COOLING REMAINING-CAPACITY | |
|---|---|---|---|---|---|---|
| | | WITH COOLING REMAINING-CAPACITY | NO COOLING REMAINING-CAPACITY | NO COOLING REMAINING-CAPACITY | NO COOLING REMAINING-CAPACITY | PC1_mar |
| WITH TEMPERATURE REMAINING-CAPACITY | WITH REMAINING-CAPACITY | PRIORITY OUTPUT: FIRST BATTERY<br>FIRST COOLING MODE: ACTIVE COOLING<br>SECOND COOLING MODE: ACTIVE COOLING | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: COOLING MAX | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: COOLING MAX | PRIORITY OUTPUT: FIRST BATTERY<br>STOP CHARGING/DISCHARGING: SECOND BATTERY<br>FIRST COOLING MODE: COOLING MAX<br>SECOND COOLING MODE: COOLING MAX | |
| WITH TEMPERATURE REMAINING-CAPACITY | NO REMAINING-CAPACITY | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: ACTIVE COOLING<br>COOLING MAX | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: ACTIVE COOLING | PRIORITY OUTPUT: FIRST BATTERY<br>STOP CHARGING/DISCHARGING: SECOND BATTERY<br>FIRST COOLING MODE: COOLING MAX<br>SECOND COOLING MODE: ACTIVE COOLING | PRIORITY OUTPUT: FIRST BATTERY<br>STOP CHARGING/DISCHARGING: SECOND BATTERY<br>FIRST COOLING MODE: COOLING MAX<br>SECOND COOLING MODE: COOLING MAX | |
| NO TEMPERATURE REMAINING-CAPACITY | WITH REMAINING-CAPACITY | PRIORITY OUTPUT: SECOND BATTERY<br>FIRST COOLING MODE: ACTIVE COOLING<br>SECOND COOLING MODE: ACTIVE COOLING | PRIORITY OUTPUT: FIRST BATTERY<br>FIRST OUTPUT UPPER LIMIT: DOWN<br>FIRST COOLING MODE: ACTIVE COOLING<br>SECOND COOLING MODE: COOLING MAX | PRIORITY OUTPUT: FIRST BATTERY<br>FIRST OUTPUT UPPER LIMIT: DOWN<br>FIRST COOLING MODE: ACTIVE COOLING<br>SECOND COOLING MODE: COOLING MAX | PRIORITY OUTPUT: FIRST BATTERY<br>FIRST OUTPUT UPPER LIMIT: DOWN<br>STOP CHARGING/DISCHARGING: SECOND BATTERY<br>FIRST COOLING MODE: COOLING MAX<br>SECOND COOLING MODE: COOLING MAX | |
| NO TEMPERATURE REMAINING-CAPACITY | NO REMAINING-CAPACITY | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: COOLING MAX | PRIORITY OUTPUT: FIRST BATTERY<br>STOP CHARGING/DISCHARGING: SECOND BATTERY<br>FIRST COOLING MODE: ACTIVE COOLING<br>SECOND COOLING MODE: COOLING MAX | PRIORITY OUTPUT: FIRST BATTERY<br>FIRST OUTPUT UPPER LIMIT: DOWN<br>STOP CHARGING/DISCHARGING: SECOND BATTERY<br>FIRST COOLING MODE: COOLING MAX<br>SECOND COOLING MODE: COOLING MAX | PRIORITY OUTPUT: FIRST BATTERY<br>FIRST OUTPUT UPPER LIMIT: DOWN<br>STOP CHARGING/DISCHARGING: SECOND BATTERY<br>FIRST COOLING MODE: COOLING MAX<br>SECOND COOLING MODE: COOLING MAX | |
| T1_mar | T2_mar | | | | | PC2_mar |

POWER SUPPLY SYSTEM FOR MOBILE BODY

This application is based on and claims the benefit of priority from Japanese Patent Application No. 2021-046218, filed on 19 Mar. 2021, the content of which is incorporated herein by reference.

BACKGROUND OF THE INVENTION

Field of the Invention

The present invention relates to a power supply system for a mobile body. More specifically, the present invention relates to a power supply system mountable on a mobile body and including two electrical storage devices and a cooler.

Related Art

In recent years, electric vehicles, such as electric transport equipment equipped with a drive motor as a motive power generation source and hybrid vehicles equipped with a drive motor and an internal combustion engine as motive power generation sources, have been developed actively. Such an electric vehicle is also equipped with a power supply device, such as an electrical storage device (for example, a battery or a capacitor) or a fuel cell, for supplying electrical energy to the drive motor. Recently, electric vehicles equipped with a plurality of power supply devices with different characteristics have also been developed.

Japanese Unexamined Patent Application, Publication No. 2017-169311 discloses a power supply system of an electric vehicle. This power supply system includes a power circuit that connects a drive unit constituted by a drive motor, an inverter, etc. to a first electrical storage device, a second electrical storage device that is connected to the power circuit via a voltage converter, and a controller that controls the voltage converter to perform switching control. The controller sets, according to a demand from a driver, a target current for a passing current, which is an electrical current passing through the voltage converter, controls the voltage converter to perform switching control such that the passing current becomes equal to the target current, combines electric power outputted from the first electrical storage device and electric power outputted from the second electrical storage device, and supplies the combined power to the drive motor.

Patent Document 1: Japanese Unexamined Patent Application, Publication No. 2017-169311

SUMMARY OF THE INVENTION

When two electrical storage devices are connected to each other via a voltage converter as in the case of the above power supply system, the electric power outputted from the second electrical storage device can be basically controlled by the switching control of the voltage converter. However, when a large amount of electric power is required by the drive motor, for example, during acceleration, the electric current flowing through the first electrical storage device increases, which may make a closed circuit voltage of the first electrical storage device lower than a static voltage of the second electrical storage device. In this case, the second electrical storage device may turn to discharge, and an unintended current may flow from the second electrical storage device side to the first electrical storage device side through the voltage converter. At this time, if the second electrical storage device is at a high temperature, the degradation of the second electrical storage device may be promoted.

An object of the present invention is to provide a power supply system for a mobile body, the power supply system being capable of preventing or reducing unintended charging/discharging of a second electrical storage device being in a high temperature state.

(1) A power supply system (for example, a power supply system 1 described later) according to an embodiment of the present invention includes: a first power circuit (for example, a first power circuit 2 described later) including a first electrical storage device (for example, a first battery B1 described later); a second power circuit (for example, a second power circuit 3 described later) including a second electrical storage device (for example, a second battery B2 described later) having an operating voltage range which overlaps that of the first electrical storage device relative to a closed circuit voltage, the second electrical storage device having a static voltage which is lower than that of the first electrical storage device; a voltage converter (for example, a voltage converter 5 described later) that converts a voltage between the first power circuit and the second power circuit; a power converter (for example, a power converter 43 described later) that converts power between the first power circuit and a rotary electrical machine (for example, a drive motor M described later); a power controller (for example, a management ECU 71, a motor ECU 72, and a converter ECU 73 described later) that operates the voltage converter and the power converter to control charging and discharging of the first and second electrical storage devices; a potential difference acquirer (for example, a management ECU 71, a first battery ECU 74, a second battery ECU 75, a first battery sensor unit 81, and a second battery sensor unit 82 described later) that acquires a potential difference between the first electrical storage device and the second electrical storage device; a cooler (for example, a second cooler 92 described later) that cools the second electrical storage device; a cooling output controller (for example, a cooling circuit ECU 76 described later) that controls cooling output by the cooler; and a temperature acquirer (for example, a second battery ECU 75 and a second battery sensor unit 82 described later) that acquires a temperature of the second electrical storage device. The power supply system further includes: a temperature remaining-capacity acquirer (for example, a second battery ECU 75 and a second battery sensor unit 82 described later) that acquires a temperature remaining-capacity (for example, a second temperature remaining-capacity T2_mar described later) increasing or decreasing depending on a difference between an upper limit temperature of the second electrical storage device and the temperature of the second electrical storage device; and a cooling remaining-capacity acquirer (for example, a cooling circuit ECU 76 described later) that acquires a cooling remaining-capacity (for example, a second cooling remaining-capacity PC2_mar described later) increasing or decreasing depending on a difference between maximum cooling output and the cooling output of the cooler. The power controller is configured to stop the voltage converter in a case where at least one of the temperature remaining-capacity and the cooling remaining-capacity is less than an associated one of a threshold value for the temperature remaining-capacity and a threshold value for the cooling remaining-capacity and the potential difference is equal to or more than a potential difference threshold value.

(2) In this case, it is preferable that after stopping the voltage converter, the power controller starts driving the voltage converter in response to the temperature remaining-capacity and the cooling remaining-capacity both becoming equal to or more than the threshold values.

(3) In this case, preferably, the power controller shuts off the second electrical storage device from the second power circuit in a case where at least one of the temperature remaining-capacity and the cooling remaining-capacity is less than the associated one of the threshold value for the temperature remaining-capacity and the threshold value for the cooling remaining-capacity and the potential difference is less than the potential difference threshold value.

(4) A power supply system (for example, a power supply system 1 described later) according to an embodiment of the present invention includes: a first power circuit (for example, first power circuit 2 described later) including a first electrical storage device (for example, a first battery B1 described later); a second power circuit (for example, a second power circuit 3 described later) including a second electrical storage device (for example, a second battery B2 described later) having an operating voltage range which overlaps that of the first electrical storage device relative to a closed circuit voltage, the second electrical storage device having a static voltage which is lower than that of the first electrical storage device; a voltage converter (for example, a voltage converter 5 described later) that converts a voltage between the first power circuit and the second power circuit; a power converter (for example, a power converter 43 described later) that converts power between the first power circuit and a rotary electrical machine (for example, a drive motor M described later) for generating a propulsive force; a power controller (for example, a management ECU 71, a motor ECU 72, and a converter ECU 73 described later) that operates the voltage converter and the power converter to control charging and discharging of the first and second electrical storage devices; a potential difference acquirer (for example, a management ECU 71, a first battery ECU 74, a second battery ECU 75, a first battery sensor unit 81, and a second battery sensor unit 82 described later) that acquires a potential difference between the first electrical storage device and the second electrical storage device; a cooler (for example, a second cooler 92 described later) that cools the second electrical storage device; a cooling output controller (for example, a cooling circuit ECU 76 described later) that controls cooling output by the cooler; and a temperature acquirer (for example, a second battery ECU 75 and a second battery sensor unit 82 described later) that acquires a temperature of the second electrical storage device. The power supply system further includes: a temperature remaining-capacity acquirer (for example, a second battery ECU 75 and a second battery sensor unit 82 described later) that acquires a temperature remaining-capacity (for example, a second temperature remaining-capacity T2_mar described later) increasing or decreasing depending on a difference between an upper limit temperature of the second electrical storage device and the temperature of the second electrical storage device; and a cooling remaining-capacity acquirer (for example, a cooling circuit ECU 76 described later) that acquires a cooling remaining-capacity (for example, a second cooling remaining-capacity PC2_mar described later) increasing or decreasing depending on a difference between maximum cooling output and the cooling output of the cooler. The power controller is configured to shut off the second electrical storage device from the second power circuit in a case where at least one of the temperature remaining-capacity and the cooling remaining-capacity is less than an associated one of a threshold value for the temperature remaining-capacity and a threshold value for the cooling remaining-capacity and the potential difference is less than the potential difference threshold value.

(5) In this case, it is preferable that after shutting off the second electrical storage device from the second power circuit, the power controller connects the second electrical storage device to the second power circuit in response to the temperature remaining-capacity and the cooling remaining-capacity both becoming equal to or more than the threshold values.

(6) In this case, preferably, the power controller stops the voltage converter in a case where at least one of the temperature remaining-capacity and the cooling remaining-capacity is less than the associated one of the threshold value for the temperature remaining-capacity and the threshold value for the cooling remaining-capacity and the potential difference is equal to or more than the potential difference threshold value.

(7) In this case, preferably, the power controller controls the charging and discharging of the first and second electrical storage devices in a normal mode or an output priority mode that allows output, which is larger than that in the normal mode, from the first power circuit to the rotary electrical machine, and in a case where an operation mode of the power controller is the output priority mode and the cooling remaining-capacity is equal to or more than the cooling remaining-capacity threshold value, the cooling output controller increases the cooling output as compared with a case where the operation mode is the normal mode.

(1) In the power supply system of the present invention, the first power circuit including the first electrical storage device is connected, via the voltage converter, to the second power circuit including the second electrical storage device, which has the operating voltage range relative to the closed circuit voltage that overlaps that of the first battery and which has a lower static voltage than the first battery, and the first power circuit is connected to the drive motor via the power converter. The potential difference acquirer acquires a potential difference between the first electrical storage device and the second electrical storage device, the temperature remaining-capacity acquirer acquires the temperature remaining-capacity increasing or decreasing depending on the difference between the upper limit temperature of the second electrical storage device and the temperature of the second electrical storage device, and the cooling remaining-capacity acquirer acquires the cooling remaining-capacity increasing or decreasing depending on the difference between the maximum cooling output and the cooling output of the cooler for cooling the second electrical storage device. Further, the power controller is configured to stop the voltage converter in the case where at least one of the temperature remaining-capacity and the cooling remaining-capacity is less than the associated one of the threshold value for the temperature remaining-capacity and the threshold value for the cooling remaining-capacity and the potential difference is equal to or more than the potential difference threshold value. Here, stopping the voltage converter makes it possible to prevent the electrical current from flowing into at least the second electrical storage device, whereby the temperature of the second electrical storage device can be reduced thereafter. Therefore, the present invention makes it possible to prevent unintended charging/discharging of the second electrical storage device being in a high temperature state. In particular, the power supply system of the resent invention determines the timing at which the voltage converter is stopped in consideration of not only the temperature remaining-capacity but also the cooling remaining-capacity, and thus can stop the voltage converter at an appropriate timing in consideration of the cooling performance provided on the second electrical storage device by the cooler. In the present invention, when the potential difference is equal to or more than the potential difference threshold value, only the voltage converter is stopped, thereby making it possible to quickly charge and discharge the second electrical storage device as necessary. When only the voltage converter is stopped, the power of the second electrical storage device may unintentionally flow through the freewheeling diode of the switching element constituting the voltage converter, and the temperature of the second electrical storage device may rise. To address this, the present invention stops the voltage converter when the potential difference is equal to or more than the potential difference threshold value, thereby preventing the power of the second electrical storage device from unintentionally flowing through the voltage converter.

(2) After stopping the voltage converter, the power controller starts driving the voltage converter in response to the temperature remaining-capacity and the cooling remaining-capacity both becoming equal to or more than the threshold values. This feature makes it possible to reliably prevent unintended charging/discharging of the second electrical storage device being in the high temperature state.

(3) The power controller shuts off the second electrical storage device from the second power circuit in the case where at least one of the temperature remaining-capacity and the cooling remaining-capacity is less than the associated one of the threshold value for the temperature remaining-capacity and the threshold value for the cooling remaining-capacity, and the potential difference is less than the potential difference threshold value. Here, when the second electrical storage device is shut off from the second power circuit, the charging/discharging of the second electrical storage device can be reliably prevented, whereby the temperature of the second electrical storage device can be reduced thereafter. Therefore, the present invention makes it possible to prevent unintended charging/discharging of the second electrical storage device being in a high temperature state. In particular, the power supply system of the present invention determines the timing at which the second electrical storage device is shut off from the second power circuit in consideration of not only the temperature remaining-capacity but also the cooling remaining-capacity, and thus can shut off the second electrical storage device from the second power circuit at an appropriate timing in consideration of the cooling performance provided on the second electrical storage device by the cooler.

(4) In the present invention, the power controller shuts off the second electrical storage device from the second power circuit and reliably prevents the charging/discharging of the second electrical storage device in the case where at least one of the temperature remaining-capacity and the cooling remaining-capacity is less than the associated one of the threshold value for the temperature remaining-capacity and the threshold value for the cooling remaining-capacity and the potential difference is less than the potential difference threshold value. This feature makes it possible to reliably prevent unintended charging/discharging of the second electrical storage device being in the high temperature state. In particular, the power supply system of the present invention determines the timing at which the second electrical storage device is shut off from the second power circuit in consideration of not only the temperature remaining-capacity but also the cooling remaining-capacity, and thus can shut off the second electrical storage device from the second power circuit at an appropriate timing in consideration of the cooling performance provided on the second electrical storage device by the cooler. When only the voltage converter is stopped as described above, a small potential difference may allow the power of the second electrical storage device to flow through the voltage converter, and the temperature of the second electrical storage device may rise. To address this, the present invention shuts off the second electrical storage device from the second power circuit in the case where the potential difference is equal to or more than the potential difference threshold value, thereby making it possible to reliably prevent rise of the temperature of the second electrical storage device.

(5) After shutting off the second electrical storage device from the second power circuit, the power controller connects the second electrical storage device to the second power circuit in response to the temperature remaining-capacity and the cooling remaining-capacity both becoming equal to or more than the threshold values. This feature makes it possible to reliably prevent unintended charging/discharging of the second electrical storage device being in the high temperature state.

(6) The power controller stops the voltage converter and prevents the electrical current from flowing to at least the second electrical storage device in the case where at least one of the temperature remaining-capacity and the cooling remaining-capacity is less than the associated one of the threshold value for the temperature remaining-capacity and the threshold value for the cooling remaining-capacity, and the potential difference is less than the potential difference threshold value. This feature makes it possible to reliably prevent unintended charging/discharging of the second electrical storage device being in the high temperature state. According to the present invention, when the potential difference is equal to or more than the potential difference threshold value, only the voltage converter is stopped, thereby making it possible to quickly charge and discharge the second electrical storage device as necessary.

(7) When the operation mode is the output priority mode and the cooling remaining-capacity is equal to or more than the cooling remaining-capacity threshold value, the cooling output controller increases the cooling output as compared with the case where the operation mode is the normal mode. Thus, since the temperature remaining-capacity can be increased quickly, the chances of charging and discharging the second electrical storage device in the output priority mode can be increased.

BRIEF DESCRIPTION OF THE DRAWINGS

FIG. 7 shows an example of an operation table for determining an output and a cooling mode of a battery based on a temperature remaining-capacity and a cooling remaining-capacity.

DETAILED DESCRIPTION OF THE INVENTION

Figure 1:
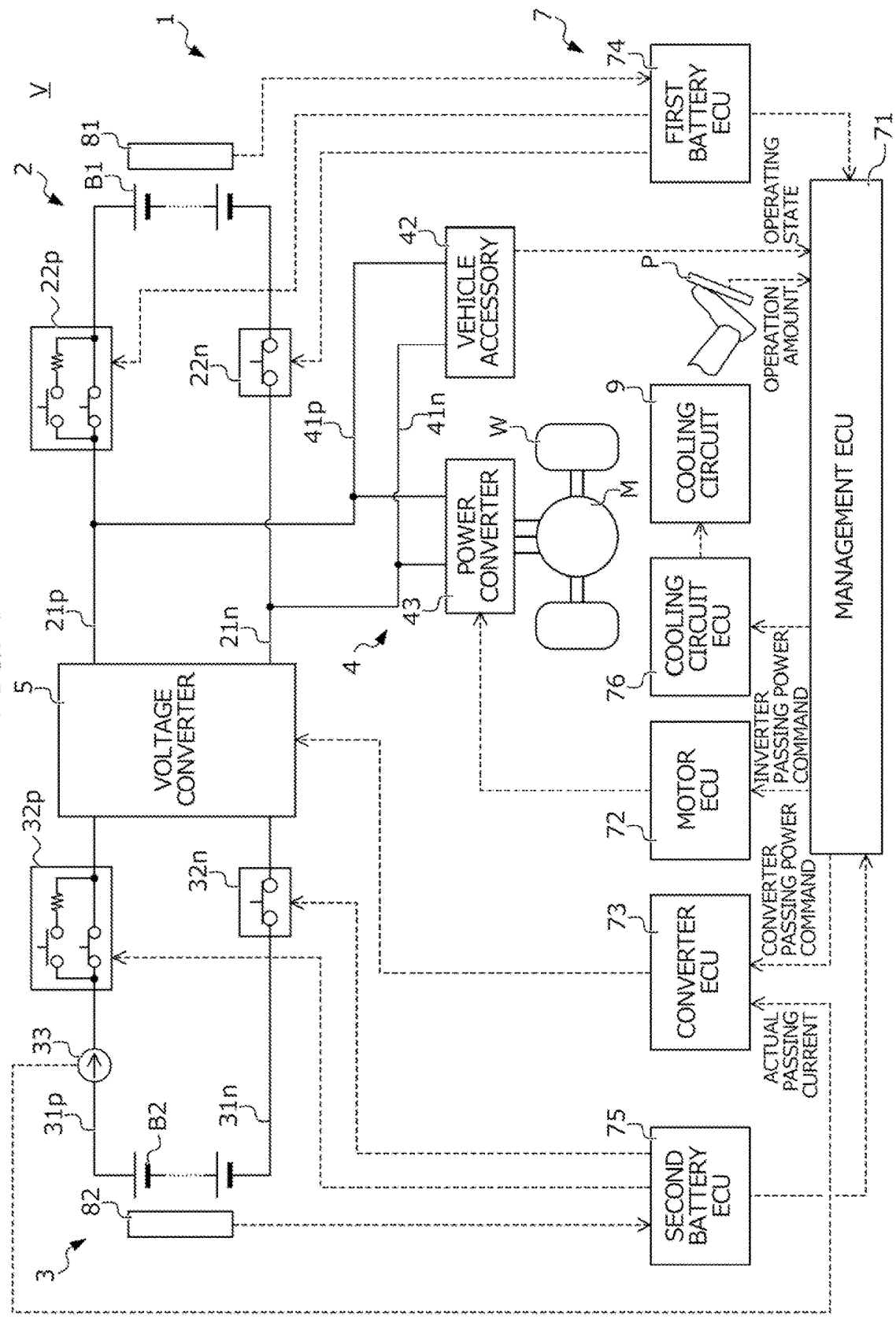
FIG. 1 is a diagram showing the configuration of a vehicle equipped with a power supply system according to an embodiment of the present invention.

An embodiment of the present invention will be described with reference to the drawings. FIG. 1 is a diagram showing the configuration of a four-wheeled electric vehicle V (hereinafter simply referred as "vehicle") equipped with a power supply system 1 according to the present embodiment. In the present embodiment, a case will be described where the power supply system 1 is mounted on the four-wheeled vehicle V, but the present invention is not limited thereto. The power supply system according to the present invention may be applied to not only the four-wheeled vehicle V, but also mobile bodies such as a saddled vehicle, a ship, a robot, and an unmanned aircraft, which move by a propulsive force generated by a rotary electrical machine, and a stationary power source.

The vehicle V includes drive wheels W, a drive motor M as a rotary electrical machine coupled to the drive wheels W; and the power supply system 1 which transfers power between the drive motor M and a first battery B1 and a second battery B2 described later. It should be noted that the present embodiment will be described based on an example in which the vehicle V accelerates and decelerates with the motive power generated mainly by the drive motor M; however, the present invention is not to be limited thereto. The vehicle V may be configured as a so-called hybrid vehicle equipped with the drive motor M and an engine as the motive power generation sources.

The drive motor M is coupled to the drive wheels W via a power transmission mechanism (not shown). The drive motor M generates torque by receiving three-phase alternating current power supplied from the power supply system 1. The generated torque is transmitted to the drive wheels W via the power transmission mechanism (not shown) to cause the drive wheel W to rotate and the vehicle V to move. In addition, the drive motor M performs a function as a generator during deceleration of the vehicle V, generates regenerative electric power, and provides the drive wheels W with regenerative braking torque corresponding to the magnitude of the regenerative electric power. The regenerative electric power generated by the drive motor M is charged to the batteries B1, B2 of the power supply system 1 as appropriate.

The power supply system 1 includes a first power circuit 2 to which the first battery B1 is connected, a second power circuit 3 to which the second battery B2 is connected, a voltage converter 5 which connects the first power circuit 2 to the second power circuit 3, a load circuit 4 including various electrical loads including the drive motor M, a cooling circuit 9 for cooling the first battery B1 and the second battery B2, and an electronic control unit group 7 which controls, for example, flow of power in the power circuits 2, 3, and 4, charging/discharging of the batteries B1 and B2, and cooling output of the cooling circuit 9 by operating the power circuits 2, 3, and 4, the cooling circuit 9, and the voltage converter 5. The electronic control unit group 7 includes a management ECU 71, a motor ECU 72, a converter ECU 73, a first battery ECU 74, a second battery ECU 75, and a cooling circuit ECU 76 which are each a computer.

The first battery B1 is a secondary battery capable of both discharging which converts chemical energy into electrical energy, and charging which converts the electrical energy into chemical energy. In the following, a case is described in which a so-called lithium-ion storage battery which performs charging/discharging by means of lithium ions moving between electrodes is employed as the first battery B1; however, the present invention is not limited thereto.

The first battery B1 is provided with a first battery sensor unit 81 for estimating an internal state of the first battery B1. The first battery sensor unit 81 includes a plurality of sensors that detect physical quantities required for the first battery ECU 74 to acquire a charge rate of the first battery B1 (an amount of electricity stored in the battery expressed as a percentage) corresponding to a battery level of the first battery B1 and a temperature of the first battery B1. The plurality of sensors transmit signals corresponding to the detection values to the first battery ECU 74. More specifically, the first battery sensor unit 81 includes, for example, a voltage sensor that detects a terminal voltage of the first battery B1, a current sensor that detects an electrical current flowing in the first battery B1, and a temperature sensor that detects a temperature of the first battery B1.

The second battery B2 is a secondary battery capable of both discharging that converts chemical energy into electrical energy, and charging that converts electrical energy into chemical energy. In the following, a case is described in which a so-called lithium-ion battery which performs charging/discharging by way of lithium ions moving between electrodes is employed as the second battery B2; however, the present invention is not limited thereto. The second battery B2 may be configured as, for example, a capacitor.

The second battery B2 is provided with a second battery sensor unit 82 for estimating an internal state of the second battery B2. The second battery sensor unit 82 includes a plurality of sensors that detect physical quantities required for the second battery ECU 75 to acquire a charge rate, a temperature, etc. of the second battery B2. The plurality of sensors transmit signals corresponding to the detection values to the second battery ECU 75. More specifically, the second battery sensor unit 82 include, for example, a voltage sensor that detects a terminal voltage of the second battery B2, a current sensor that detects an electrical current flowing in the second battery B2, and a temperature sensor that detects a temperature of the second battery B2.

Here, the characteristics of the first battery B1 are compared with the characteristics of the second battery B2. The first battery B1 has a lower output-weight density and a higher energy-weight density than the second battery B2. In addition, the first battery B1 has a larger discharge capacity than the second battery B2. In other words, the first battery B1 is superior to the second battery B2 in terms of energy-weight density. The energy-weight density refers to an amount of electric power per unit weight (Wh/kg), and the output-weight density refers to electric power per unit weight (W/kg). Therefore, the first battery B1 that excels in the energy-weight density is a capacitance-type accumulator with high capacity as its main purpose, whereas the second battery B2 that excels in output-weight density is an output-type accumulator with high output as its main purpose. For this reason, the power supply system 1 uses the first battery B1 as the main power source, and uses the second battery B2 as an auxiliary power source which supplements the first battery B1. Further, the first battery B1 has a larger heat capacity than the second battery B2. Therefore, the temperature of the first battery B1 rises more gently than that of the second battery B2.

Figure 2:
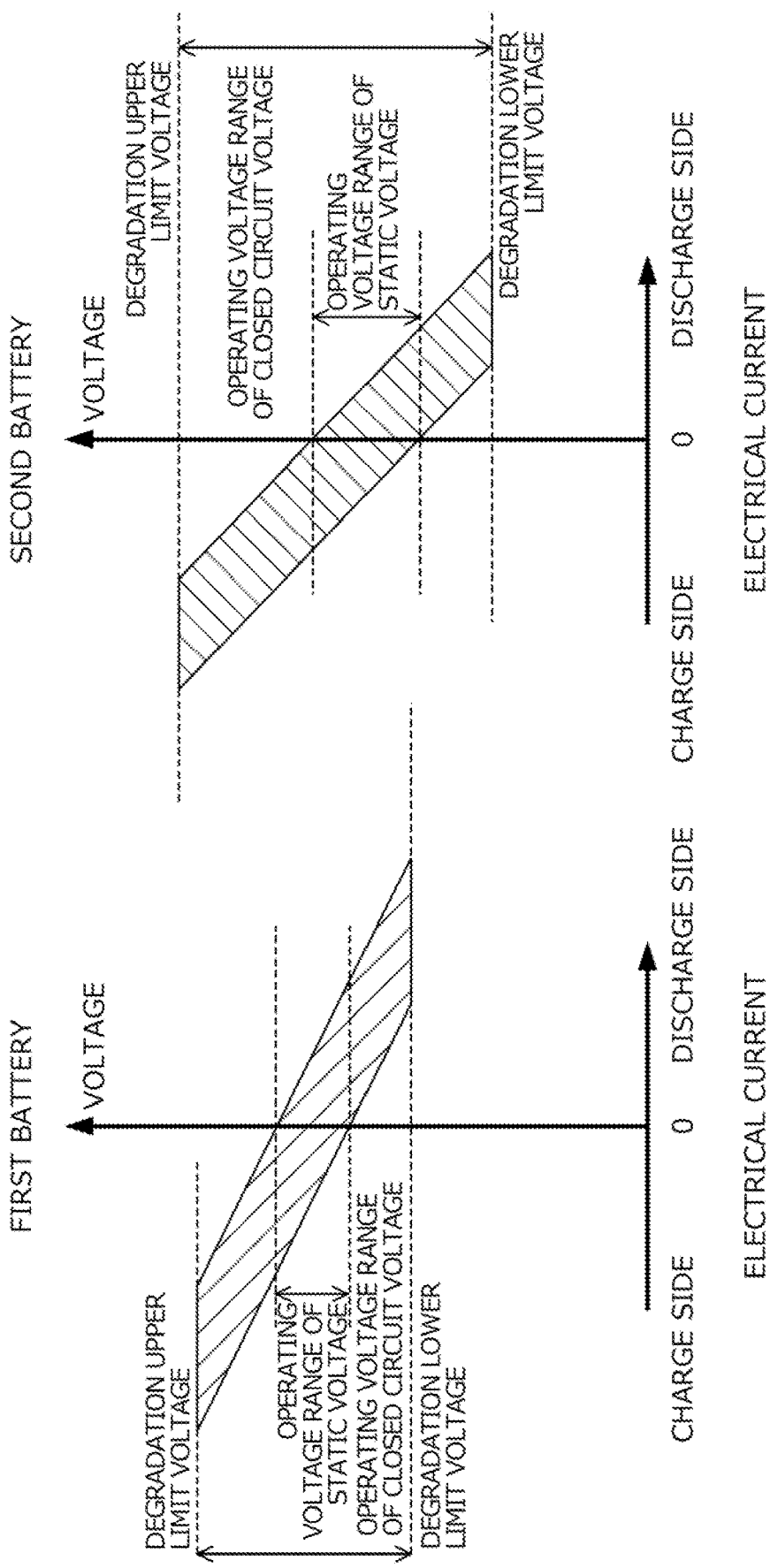
FIG. 2 provides graphs comparing operating voltage ranges of a first battery and a second battery.

FIG. 2 provides graphs comparing the operating voltage ranges of the first battery B1 and the second battery B2 in the power supply system 1. In FIG. 2, the left graph shows the operating voltage range of the first battery B1, and the right graph shows the operating voltage range of the second battery B2. In FIG. 2, the horizontal axis represents the electrical current flowing in the battery, and the vertical axis represents the voltage of the battery.

As shown in FIG. 2, the static voltage of the batteries B1, B2 (i.e., a voltage in a state in which electrical current is not flowing to the battery, referred to also as an open circuit voltage) has a characteristic that it increases as the charge rate increases. Therefore, for each of the batteries B1, B2, the upper limit and the lower limit of the operating voltage range relative to static voltage are the static voltage in a state where the charge rate has the maximum value (e.g., 100%) and the static voltage in a state where the charge rate has the minimum value (e.g., 0%), respectively. As shown in FIG. 2, the upper limit of the operating voltage range relative to static voltage of the second battery B2 is lower than the upper limit of the operating voltage range relative to static voltage of the first battery B1. For this reason, while the vehicle V is in motion, the static voltage of the second battery B2 is basically maintained lower than the static voltage of the first battery B1.

As shown in FIG. 2, the closed circuit voltage of each of the batteries B1, B2 (i.e., the voltage in a state in which an electrical current is flowing to the battery) has a characteristic that it increases as the charge rate increases. Since internal resistance exists in the batteries B1, B2, the closed circuit voltage thereof has a characteristic that it decreases from the static voltage as the discharge current increases, and increases from the static voltage as the charge current increases. Therefore, for each of the batteries B1, B2, the upper limit of the operating voltage range relative to closed circuit voltage is higher than the upper limit of the respective operating voltage range relative to static voltage, and the lower limit of the operating voltage range relative to closed circuit voltage is lower than the lower limit of the respective operating voltage range relative to static voltage. In other words, the operating voltage range relative to closed circuit voltage of each of the batteries B1, B2 includes the operating voltage range relative to static voltage. As shown in FIG. 2, the operating voltage range relative to closed circuit voltage of the first battery B1 overlaps the operating voltage range relative to closed circuit voltage of the second battery B2.

Since the degradation of the batteries B1, B2 is promoted when the charge current increases excessively, the upper limit of the operating voltage range relative to closed circuit voltage of the batteries B1, B2 is set so that the batteries B1, B2 will not degrade, based on the states of the batteries B1, B2. Hereinafter, the upper limit of the use range of closed circuit voltage of the batteries B1, B2 is also referred to as the degradation upper limit voltage.

Since the degradation of the batteries B1, B2 is promoted when the discharge current increases excessively, the lower limit of the operating voltage range relative to closed circuit voltage of the batteries B1, B2 is set so that the batteries B1, B2 will not degrade, based on the states of these batteries B1, B2. Hereinafter, the lower limit of the operating voltage range relative to closed circuit voltage of the batteries B1, B2 is also referred to as the degradation lower limit voltage.

Referring back to FIG. 1, the first power circuit 2 includes: the first battery B1, first power lines 21p, 21n which connect a positive electrode and a negative electrode of the first battery B1 to a positive terminal and a negative terminal of a high-voltage side of the voltage converter 5, and a positive contactor 22p and a negative contactor 22n provided to the first power lines 21p, 21n.

The contactors 22p, 22n are of a normal open type which open in a state in which a command signal from outside is not being inputted and electrically disconnect both electrodes of the first battery B1 from the first power lines 21p, 21n, and which close in a state in which a command signal is being inputted and connect the first battery B1 to the first power lines 21p, 21n. The contactors 22p, 22n open/close in response to a command signal transmitted from the first battery ECU 74. The positive contactor 22p is a pre-charge contactor having a pre-charge resistance for reducing an inrush current to a plurality of smoothing capacitors provided to the first power circuit 2, the load circuit 4, etc.

The second power circuit 3 includes: the second battery B2, second power lines 31p, 31n which connect a positive electrode and a negative electrode of the second battery B2 to a positive terminal and a negative terminal of a low-voltage side of the voltage converter 5, a positive contactor 32p and a negative contactor 32n provided to the second power lines 31p, 31n, and a current sensor 33 provided to the second power line 31p.

The contactors 32p, 32n are of a normal-open type which open in a state in which a command signal from outside is not being inputted and electrically disconnect both electrodes of the second battery B2 from the second power lines 31p, 31n, and which close in a state in which a command signal is being inputted and connect the second battery B2 to the second power lines 31p, 31n. The contactors 32p, 32n open/close in response to a command signal transmitted from the second battery ECU 75. The positive contactor 32p is a pre-charge contactor having a pre-charge resistance for reducing an inrush current to a plurality of smoothing capacitors provided to the first power circuit 2, the load circuit 4, etc.

The electric current sensor 33 transmits, to the converter ECU 73, a detection signal corresponding to a value of a passing current, which is the electrical current flowing through the second power line 31p, i.e., the electrical current flowing through the voltage converter 5. It should be noted that, in the present embodiment, a direction of the passing current from the second power circuit 3 to the first power circuit 2 is defined as a positive, and a direction of the passing current from the first power circuit 2 to the second power circuit 3 is defined as a negative. In other words, the passing current that passes through the voltage converter 5 becomes positive when the second battery B2 discharges, and becomes negative when the second battery B2 is charged.

The load circuit 4 includes: a vehicle accessory 42, the power converter 43 to which the drive motor M is connected, and load power lines 41p, 41n which connect the vehicle accessory 42 and power converter 43 to the first power circuit 2.

The vehicle accessory 42 is constituted by a plurality of electrical loads, such as a battery heater, an air compressor, a DC-DC converter, and an onboard charger. The vehicle accessory 42 is connected to the first power lines 21p, 21n of the first power circuit 2 via the load power lines 41p, 41n, and operates by consuming the electric power of the first power lines 21p, 21n. The information regarding operating states of the various electrical loads constituting the vehicle accessory 42 is transmitted to, for example, the management ECU 71.

The power converter 43 is connected, via the load power lines 41p, 41n, to the first power lines 21p, 21n parallel with the vehicle accessory 42. The power converter 43 converts the electric power between the first power lines 21p, 21n and the drive motor M. The power converter 43 is, for example, a PWM inverter based on pulse width modulation and provided with a bridge circuit constituted by a plurality of switching elements (e.g., IGBTs) that are bridge connected, and has a function of performing conversion between DC power and AC power. The power converter 43 has a DC I/O side connected to the first power lines 21p, 21n, and an AC I/O side connected to each coil of the U phase, V phase and W phase of the drive motor M. The power converter 43 converts the DC power of the first power lines 21p, 21n into three-phase AC power and supplies it to the drive motor M, and converts the three-phase AC power supplied from the drive motor M into DC power and supplies it to the first power lines 21p, 21n, by ON/OFF driving the switching elements of the respective phases in accordance with a gate drive signal generated at a predetermined timing by a gate drive circuit (not shown) of the motor ECU 72.

The voltage converter 5 connects the first power circuit 2 to the second power circuit 3, and converts the voltage between the circuits 2, 3. The voltage converter 5 includes a known boost circuit.

Figure 3:
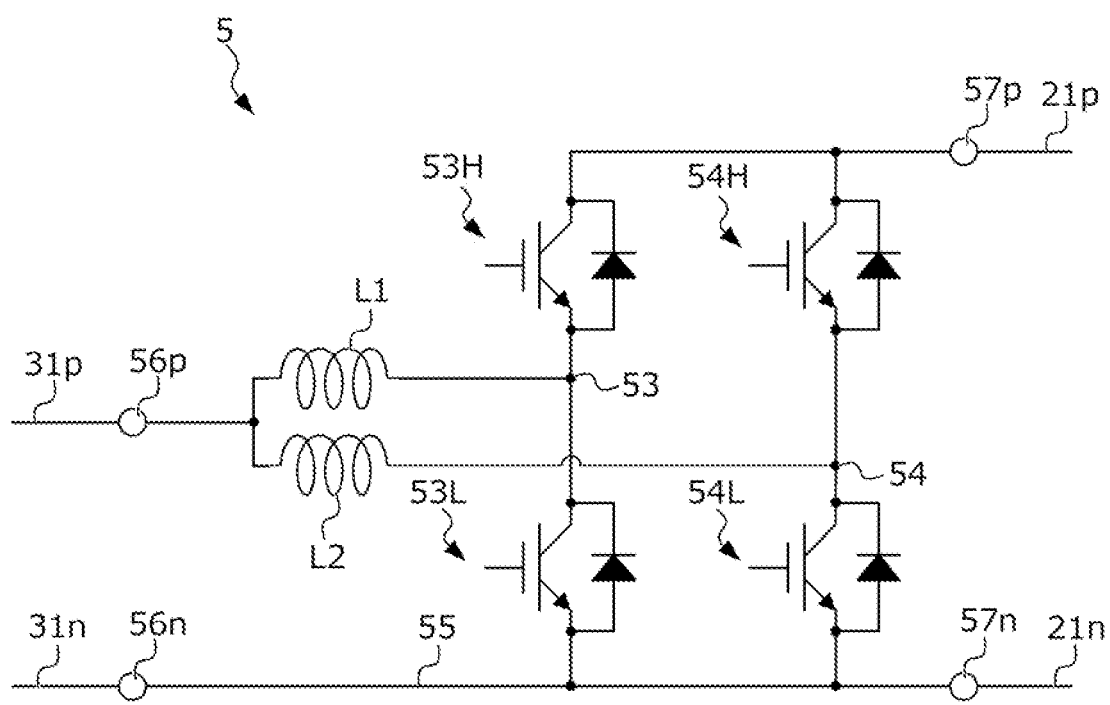
FIG. 3 is a diagram showing an example of the circuit configuration of a voltage converter.

FIG. 3 is a diagram showing an example of the circuit configuration of the voltage converter 5. The voltage converter 5 connects the first power lines 21p, 21n to which the first battery B1 is connected, to the second power lines 31p, 31n to which the second battery B2 is connected, and converts the voltage between the first power lines 21p, 21n and the second power lines 31p, 31n. The voltage converter 5 is a full-bridge DC-DC converter configured by combining a first reactor L1, a second reactor L2, a first high-arm element 53H, a first low-arm element 53L, a second high-arm element 54H, a second low-arm element 54L, a negative bus 55, low-voltage side terminals 56p, 56n, high-voltage side terminals 57p, 57n, and a smoothing capacitor (not shown).

The low-voltage side terminals 56p, 56n are connected to the second power lines 31p, 31n, and the high-voltage side terminals 57p, 57n are connected to the first power lines 21p, 21n. The negative bus 55 is wiring connecting the low-voltage side terminal 56n to the high-voltage side terminal 57n.

The first reactor L1 has one end connected to the low-voltage side terminal 56p, and the other end connected to a connection node 53 between the first high-arm element 53H and the first low-arm element 53L. The first high-arm element 53H and the first low-arm element 53L each include a known power switching element such as an IGBT or a MOSFET, and a freewheeling diode connected to the power switching element. The high-arm element 53H and the low-arm element 53L are connected in this order in series between the high-voltage side terminal 57p and the negative bus 55.

A collector of the power switching element of the first high-arm element 53H is connected to the high-voltage side terminal 57p, and the emitter thereof is connected to a collector of the first low-arm element 53L. An emitter of the power switching element of the first low-arm element 53L is connected to the negative bus 55. The forward direction of the freewheeling diode provided to the first high-arm element 53H is a direction from the first reactor L1 towards the high-voltage side terminal 57p. The forward direction of the freewheeling diode provided to the first low-arm element 53L is a direction from the negative bus 55 towards the first reactor L1.

The second reactor L2 has one end connected to the low-voltage side terminal 56p, and the other end connected to a connection node 54 between the second high-arm element 54H and second low-arm element 54L. The second high-arm element 54H and the second low-arm element 54L each include a known power switching element such as an IGBT or a MOSFET, and a freewheeling diode connected to the power switching element. The high-arm element 54H and the low-arm element 54L are connected in this order in series between the high-voltage side terminal 57p and the negative bus 55.

A collector of the power switching element of the second high-arm element 54H is connected to the high-voltage side terminal 57p, and the emitter thereof is connected to the collector of the second low-arm element 54L. An emitter of the power switching element of the second low-arm element 54L is connected to the negative bus 55. The forward direction of the freewheeling diode provided to the second high-arm element 54H is a direction from the second reactor L2 towards the high-voltage side terminal 57p. The forward direction of the freewheeling diode provided to the second low-arm element 54L is a direction from the negative bus 55 towards the second reactor L2.

The voltage converter 5 converts the voltage between the first power lines 21p, 21n and the second power lines 31p, 31n, by alternately driving ON/OFF the first high-arm element 53H and second low-arm element 54L, and the first low-arm element 53L and second high-arm element 54H, in accordance with the gate drive signal generated at a predetermined timing by a gate drive circuit (not shown) of the converter ECU 73.

The static voltage of the second battery B2 is basically maintained lower than the static voltage of the first battery B1. Therefore, the voltage of the first power lines 21p, 21n is basically higher than the voltage of the second power lines 31p, 31n. Therefore, in a case of driving the drive motor M using both the power outputted from the first battery B1 and the power outputted from the second battery B2, the converter ECU 73 operates the voltage converter 5 to cause the voltage converter 5 perform a boost function. The boost function refers to a function of stepping up the power of the second power lines 31p, 31n to which the low-voltage side terminals 56p, 56n are connected, and outputting the power to the first power lines 21p, 21n to which the high-voltage side terminals 57p, 57n are connected, whereby a positive passing current flows from the second power lines 31p, 31n side to the first power lines 21p, 21n side. In a case where discharge of the second battery B2 is to be reduced and the drive motor M is to be driven by only the power outputted from the first battery B1, the converter ECU 73 stops the voltage converter 5 to prevent current from flowing from the first power lines 21p, 21n to the second power lines 31p, 31n.

In a case where the first battery B1 and/or the second battery B2 is to be charged with the regenerative electric power outputted from the drive motor M to the first power lines 21p, 21n during deceleration, the converter ECU 73 operates the voltage converter 5 to cause the voltage converter 5 to perform a step-down function. The step-down function refers to a function of stepping down the electric power in the first power lines 21p, 21n to which the high-voltage side terminals 57p, 57n are connected, and outputting the power to the second power lines 31p, 31n to which the low-voltage side terminals 56*p*, 56*n* are connected, whereby a negative passing current flows from the first power lines 21*p*, 21*n* side to the second power lines 31*p*, 31*n* side.

Referring back to FIG. 1, the first battery ECU 74 is a computer mainly responsible for monitoring the state of the first battery B1 and for the open/close operation of the contactors 22*p*, 22*n* of the first power circuit 2. The first battery ECU 74 calculates, based on a known algorithm using the detection value transmitted from the first battery sensor unit 81, various parameters representing the internal state of the first battery B1, namely, the temperature of the first battery B1 (hereinafter, also referred to as "first battery temperature"), the internal resistance of the first battery B1, the static voltage of the first battery B1, the closed circuit voltage of the first battery B1, the first output upper limit corresponding to the upper limit of the power that can be outputted from the first battery B1, a first SOC corresponding to the charge rate of the first battery B1, a first temperature remaining-capacity of the first battery B1, etc. The information regarding the parameters representing the internal state of the first battery B1 acquired by the first battery ECU 74 is transmitted to the management ECU 71, for example.

Here, the first temperature remaining-capacity is a parameter indicating a margin relating to the temperature of the first battery B1. More specifically, the first temperature remaining-capacity is defined as a parameter that increases or decreases depending on the difference between a first battery upper limit temperature that is the upper limit of an operating temperature range of the first battery B1, and the first battery temperature. The first battery ECU 74 calculates the first temperature remaining-capacity by subtracting the first battery temperature from the predetermined first battery upper limit temperature. Therefore, the first temperature remaining-capacity decreases as the first battery temperature rises and approaches the first battery upper limit temperature.

The second battery ECU 75 is a computer mainly responsible for monitoring of the state of the second battery B2 and for open/close operation of the contactors 32*p*, 32*n* of the second power circuit 3. The second battery ECU 75 calculates, based on a known algorithm using the detection value sent from the second battery sensor unit 82, various parameters representing the internal state of the second battery B2, namely, the temperature of the second battery B2 (hereinafter, also referred to as "second battery temperature"), the internal resistance of the second battery B2, the static voltage of the second battery B2, the closed circuit voltage of the second battery B2, the second output upper limit corresponding to the upper limit of the power that can be outputted from the second battery B2, a second SOC corresponding to the charge rate of the second battery B2, a second temperature remaining-capacity of the second battery B2, etc. The information regarding the parameters representing the internal state of the second battery B2 acquired by the second battery ECU 75 is transmitted to the management ECU 71, for example.

Here, the second temperature remaining-capacity is a parameter indicating a margin relating to the temperature of the second battery B2. More specifically, the second temperature remaining-capacity is defined as a parameter that increases or decreases depending on the difference between a second battery upper limit temperature that is the upper limit of an operating temperature range of the second battery B2, and the second battery temperature. The second battery ECU 75 calculates the second temperature remaining-capacity by subtracting the second battery temperature from the predetermined second battery upper limit temperature. Therefore, the second temperature remaining-capacity decreases as the second battery temperature rises and approaches the second battery upper limit temperature.

Charging/discharging a battery in a high temperature state may promote degradation of the battery. For this reason, the first output upper limit of the first battery B1 and the second output upper limit of the second battery B2 are set so that they decrease as the temperatures of the respective batteries increase.

The management ECU 71 is a computer that mainly manages the flow of electric power in the overall power supply system 1. The management ECU 71 generates an inverter passing power command signal corresponding to a command related to inverter passing power, which is passing through the power converter 43, and a converter passing power command signal corresponding to a command related to converter passing power, which is passing through the voltage converter 5, by executing the power management processing to be described later with reference to FIG. 5.

The motor ECU 72 is a computer that mainly operates the power converter 43, and controls the flow of power between the first power circuit 2 and the drive motor M, that is, the flow of the inverter passing power. In the following, the inverter passing power is defined as a positive when the power flows from the first power circuit 2 to the drive motor M, that is, when the drive motor M is in power driving. Further, the inverter passing power is defined as a negative when the power flows from the drive motor M to the first power circuit 2, that is, when the drive motor M is in regenerative driving. In response to the inverter passing power command signal transmitted from the management ECU 71, the motor ECU 72 operates the power converter 43 so that the inverter passing power according to the command passes through the power converter 43, that is, the torque according to the inverter passing power is generated by the drive motor M.

The converter ECU 73 is a computer that mainly operates the voltage converter 5, and controls the flow of power between the first power circuit 2 and the second power circuit 3, that is, the flow of the converter passing power. In the following, the converter passing power is defined as a positive when the power flows from the second power circuit 3 to the first power circuit 2, that is, when the second battery B2 discharges and supplies power to the first power circuit 2. The converter passing power is defined as a negative when the power flows from the first power circuit 2 to the second power circuit 3, that is, when the second battery B2 is charged with power from the first power circuit 2. In response to the converter passing power command signal transmitted from the management ECU 71, the converter ECU 73 operates the voltage converter 5 so that the converter passing power according to the command passes through the voltage converter 5. More specifically, the converter ECU 73 calculates, based on the converter passing power command signal, a target current that is a target for the passing current in the voltage converter 5, and operates the voltage converter 5 according to a known feedback control algorithm so that a passing current (hereinafter also referred to as an "actual passing current") detected by the current sensor 33 becomes equal to the target current.

As described above, in the power supply system 1, the management ECU 71, the motor ECU 72, and the converter ECU 73 operate the voltage converter 5 and the power converter 43 to control the passing power in the voltage converter 5 and the passing power in the power converter 43, thereby enabling control of the charging/discharging of the first battery B1 and control of the charging/discharging of the second battery B2. Accordingly, in the present embodiment, the management ECU 71, the motor ECU 72, and the converter ECU 73 constitute a power controller for controlling the charging/discharging of the first battery B1 and those of the second battery B2. More specifically, the power controller controls the converter passing power to P2, and controls the inverter passing power to P1+P2, thereby making it possible to control the input/output power of the first battery B1 and the input/output power of the second battery B2 to P1 and P2, respectively.

Figure 4:
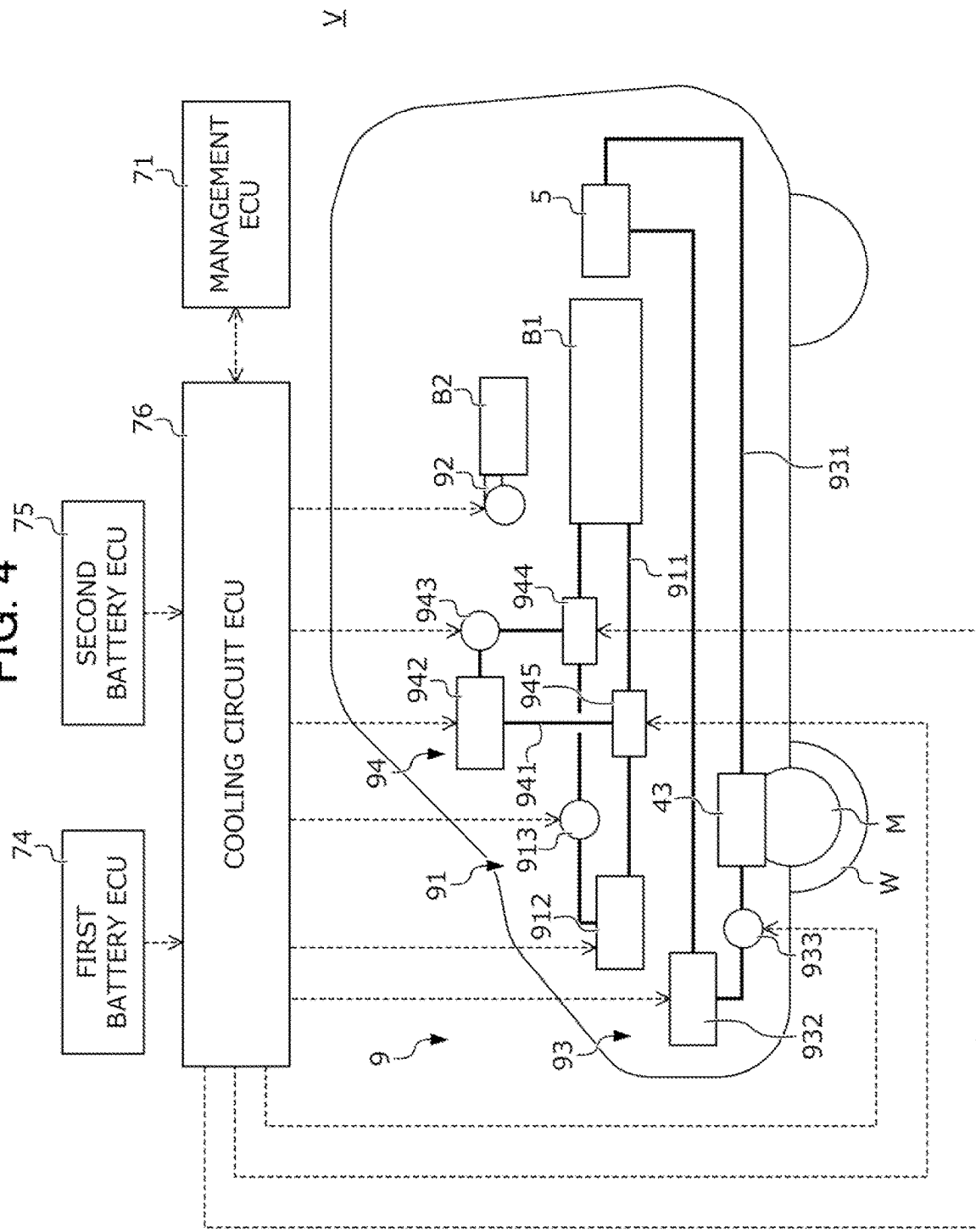
FIG. 4 is a diagram showing an example of a circuit configuration of a cooling circuit.

FIG. 4 is a diagram showing a circuit configuration of the cooling circuit 9. The cooling circuit 9 includes a first cooler 91 for cooling the first battery B1, a second cooler 92 for cooling the second batter B2, and a third cooler 93 for cooling the voltage converter 5 and the power converter 43.

The first cooler 91 includes a first cooling water circulating path 911 including a cooling water flow path formed in a battery case that houses the first battery B1, a first heat exchanger 912 and a first cooling water pump 913 provided on the first cooling water circulating path 911, and a heating device 94 connected to the first cooling water circulating path 911.

The first cooling water pump 913 rotates in response to a command inputted from the cooling circuit ECU 76, and circulates cooling water in the first cooling water circulating path 911. The first heat exchanger 912 promotes heat exchange between the cooling water circulating in the first cooling water circulating path 911 and outside air, thereby cooling the cooling water heated by the heat exchange with the first battery B1. The first heat exchanger 912 includes a radiator fan that rotates in response to a command inputted from the cooling circuit ECU 76.

The heating device 94 includes a bypass path 941 that connects an inlet and an outlet of the first heat exchanger 912 of the first cooling water circulating path 911 and bypasses the first heat exchanger 912, a heater 942 and a heating pump 943 provided on the bypass path 941, and three-way valves 944 and 945 at a connection portion between both ends of the bypass path 941 and the first cooling water circulating path 911.

The heating pump 943 rotates in response to a command inputted from the cooling circuit ECU 76, and circulates cooling water in the first cooling water circulating path 911 and the bypass path 941. The heater 942 generates heat by consuming electric power supplied from a battery (not shown), and raises the temperature of the cooling water flowing through the bypass path 941.

The three-way valves 944 and 945 open and close in response to a command from the cooling circuit ECU 76 to switch the flow path of the cooling water between the first heat exchanger 912 side and the heater 942 side. Therefore, the first cooler 91 has two functions: a cooling function of cooling the first battery B1 by circulation of the cooling water cooled by the first heat exchanger 912; and a heating function of heating the first battery B1 by circulation of the cooling water heated by the heater 942.

The cooling circuit ECU 76 controls a first cooling output of the first cooler 91 for the first battery B1 by operating the first heat exchanger 912, the first cooling water pump 913, the heater 942, the heating pump 943, and the three-way valves 944, 945, based on the first battery temperature transmitted from the first battery ECU 74, the detection value of a first cooling water temperature sensor (not shown) for detecting the temperature of the cooling water flowing through the first cooling water circulating path 911, the detection value of an outside air temperature sensor (not shown), a command from the management ECU 71, etc. Here, the first cooling output is a parameter that increases or decreases according to cooling performance provided on the first battery B1 by the first cooler 91, and is, for example, the rotation speed of the radiator fan provided in the first heat exchanger 912.

In addition, the cooling circuit ECU 76 calculates a first cooling remaining-capacity corresponding to the cooling margin of the first battery B1 by the first cooler 91, and transmits the first cooling remaining-capacity to the management ECU 71. More specifically, the cooling circuit ECU 76 calculates, as the first cooling remaining-capacity, a value obtained by subtracting the current first cooling output from a first maximum cooling output (for example, the maximum rotation speed of the radiator fan) corresponding to the maximum value of the first cooling output of the first cooler 91. In other words, the first cooling remaining-capacity increases or decreases according to the difference between the first maximum cooling output and the first cooling output. A specific procedure for controlling the first cooling output performed by the cooling circuit ECU 76 will be described later.

The second cooler 92 includes, for example, a cooling fan that supplies outside air into a battery case that houses the second battery B2. The second cooler 92 rotates in response to a command from the cooling circuit ECU 76, and supplies the outside air into the battery case of the second battery B2 to cool the second battery B2.

The cooling circuit ECU 76 controls a second cooling output of the second cooler 92 for the second battery B2 by operating the second cooler 92 based on the second battery temperature transmitted from the second battery ECU 75, the detection value of an outside air temperature sensor, and a command from the management ECU 71. Here, the second cooling output is a parameter that increases or decreases according to cooling performance provided on the second battery B2 by the second cooler 92, and is, for example, the rotation speed of the cooling fan of the second cooler 92.

In addition, the cooling circuit ECU 76 calculates a second cooling remaining-capacity corresponding to the cooling margin of the second battery B2 by the second cooler 92, and transmits the second cooling remaining-capacity to the management ECU 71. More specifically, the cooling circuit ECU 76 calculates, as the second cooling remaining-capacity, a value obtained by subtracting the current second cooling output from a second maximum cooling output (for example, the maximum rotation speed of the cooling fan) corresponding to the maximum value of the second cooling output of the second cooler 92. In other words, the second cooling remaining-capacity increases or decreases according to the difference between the second maximum cooling output and the second cooling output. A specific procedure for controlling the second cooling output performed by the cooling circuit ECU 76 will be described later.

The third cooler 93 includes a third cooling water circulating path 931 including a cooling water flow path formed in a housing in which the voltage converter 5 and the power converter 43 are installed, and a third heat exchanger 932 and a third cooling water pump 933 provided in the third cooling water circulating path 931.

The third cooling water pump 933 rotates in response to a command inputted from the cooling circuit ECU 76, and circulates cooling water in the third cooling water circulating path 931. The third heat exchanger 932 promotes heat exchange between the cooling water circulating in the third cooling water circulating path 931 and outside air, thereby cooling the cooling water heated by the heat exchange with the voltage converter 5 and the power converter 43. The third heat exchanger 932 includes a radiator fan that rotates in response to a command inputted from the cooling circuit ECU 76.

The cooling circuit ECU 76 operates the third heat exchanger 932 and the third cooling water pump 933 based on the detection value of a cooling water temperature sensor (not shown) and a command from the management ECU 71, and thereby controls the third cooling output corresponding to cooling performance provided on the voltage converter 5 and the power converter 43 by the third cooler 93.

In the present embodiment, as described above, the first cooler 91 for cooling the first battery B1 and the third cooler 93 for cooling the voltage converter 5, etc. are of a water cooling type in which the cooling is performed by heat exchange with the cooling water, and the second cooler 92 for cooling the second battery B2 having a smaller heat capacity than the first battery B1 is of an air cooling type in which the cooling is performed by heat exchange with the outside air; however, the present invention is not limited thereto. The first cooler 91 may be configured as the air cooling type, the second cooler 92 may be configured as the water cooling type, and the third cooler 93 may be configured as the air cooling type. In the present embodiment, the circulation flow path of the cooling water for cooling the first battery B1 and the circulation flow path of the cooling water for cooling the voltage converter 5 and the power converter 43 are configured as separate systems, but the present invention is not limited thereto. Both or either of the voltage converter 5 and the power converter 43 may be cooled by the cooling water for cooling the first battery B1.

Figure 5:
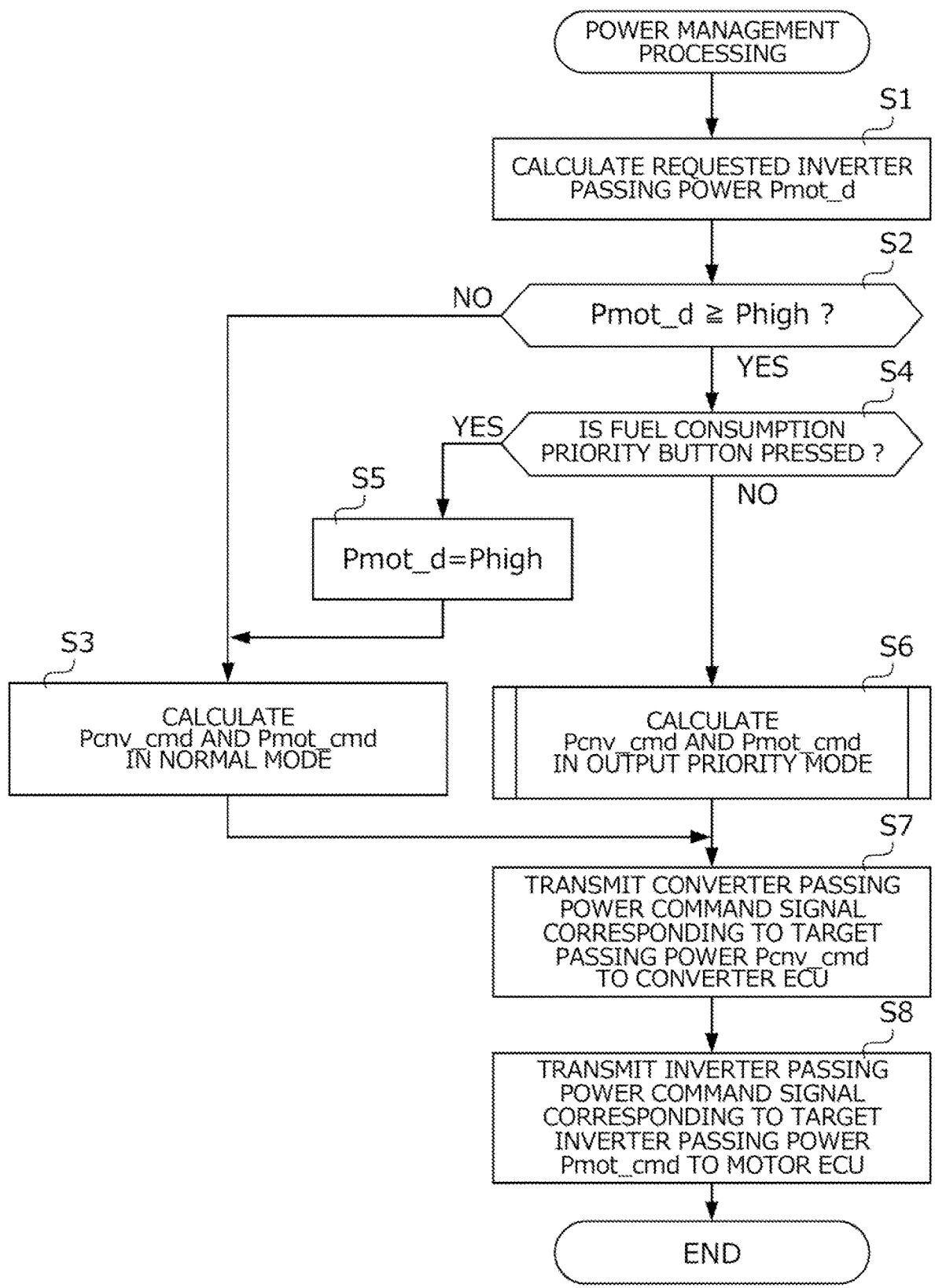
FIG. 5 is a flowchart showing a specific procedure of power management processing.

FIG. 5 is a flowchart showing a specific procedure of the power management processing. The power management processing is repeatedly executed in predetermined cycles in the management ECU 71 from a time when the driver turns on a start switch (not shown) to start operating the vehicle V and the power supply system 1 to a time when the driver then turns off the start switch to stop the operation of the vehicle V and the power supply system 1.

First, in Step S1, the management ECU 71 calculates a requested drive torque by the driver based on the operation amount of the pedals such as the accelerator pedal and brake pedal (see FIG. 1) by the driver, and converts the requested drive torque into power, thereby calculating a request for the inverter passing power in the power converter 43, that is, a requested inverter passing power Pmot_d corresponding to the requested output in the drive motor M, and then, the management ECU 71 proceeds to Step S2.

Next, in Step S2, the management ECU 71 determines whether the requested inverter passing power Pmot_d calculated in Step S1 is equal to or higher than a high output threshold value Phigh. When the determination result in Step S2 is NO, the management ECU 71 proceeds to Step S3; when the determination result is YES, the management ECU 71 proceeds to Step S4.

Next, in Step S3, the management ECU 71 calculates, in a normal mode, a target converter passing power Pcnv_cmd corresponding to the target for the converter passing power and a target inverter passing power Pmot_cmd corresponding to the target for the inverter passing power, and then, proceeds to Step S7. Here, in the normal mode, the management ECU 71 calculates the target converter passing power Pcnv_cmd and the target inverter passing power Pmot_cmd so that the power is inputted and outputted from the first battery B1 and the second battery B2 under the target ratio calculated based on a predetermined algorithm. Further, the management ECU 71 limits the target inverter passing power Pmot_cmd to the above-described high output threshold value Phigh or less in the normal mode.

Next, in Step S7, the management ECU 71 generates a converter passing power command signal corresponding to the target converter passing power Pcnv_cmd and transmits the generated signal to the converter ECU 73, and then, proceeds to Step S8. Thus, the power corresponding to the target converter passing power Pcnv_cmd is charged and discharged from the second battery B2.

Next, in Step S8, the management ECU 71 generates an inverter passing power command signal corresponding to the target inverter passing power Pmot_cmd and transmits the generated signal to the motor ECU 72, and the processing of FIG. 5 ends. Thus, the power corresponding to the target inverter passing power Pmot_cmd flows between the first power circuit 2 and the drive motor M. As a result, the power obtained by subtracting the target converter passing power Pcnv_cmd from the target inverter passing power Pmot_cmd is charged and discharged from the first battery B1.

Next, in Step S4, the management ECU 71 determines whether a fuel consumption priority button (not shown) is pressed by the driver, in other words, whether the driver gives an instruction to allow an execution in an output priority mode to be described later. When the determination result in Step S4 is YES, the management ECU 71 proceeds to Step S5, performs limit processing for limiting the requested inverter passing power Pmot_d, which has been calculated in Step S1, to less than a predetermined value. Thereafter, the management ECU 71 proceeds to Step S3. In the limit processing in Step S5, the management ECU 71 sets, for example, the high output threshold value Phigh as the requested inverter passing power Pmot_d, thereby limiting the requested inverter passing power Pmot_d.

Figure 6A:
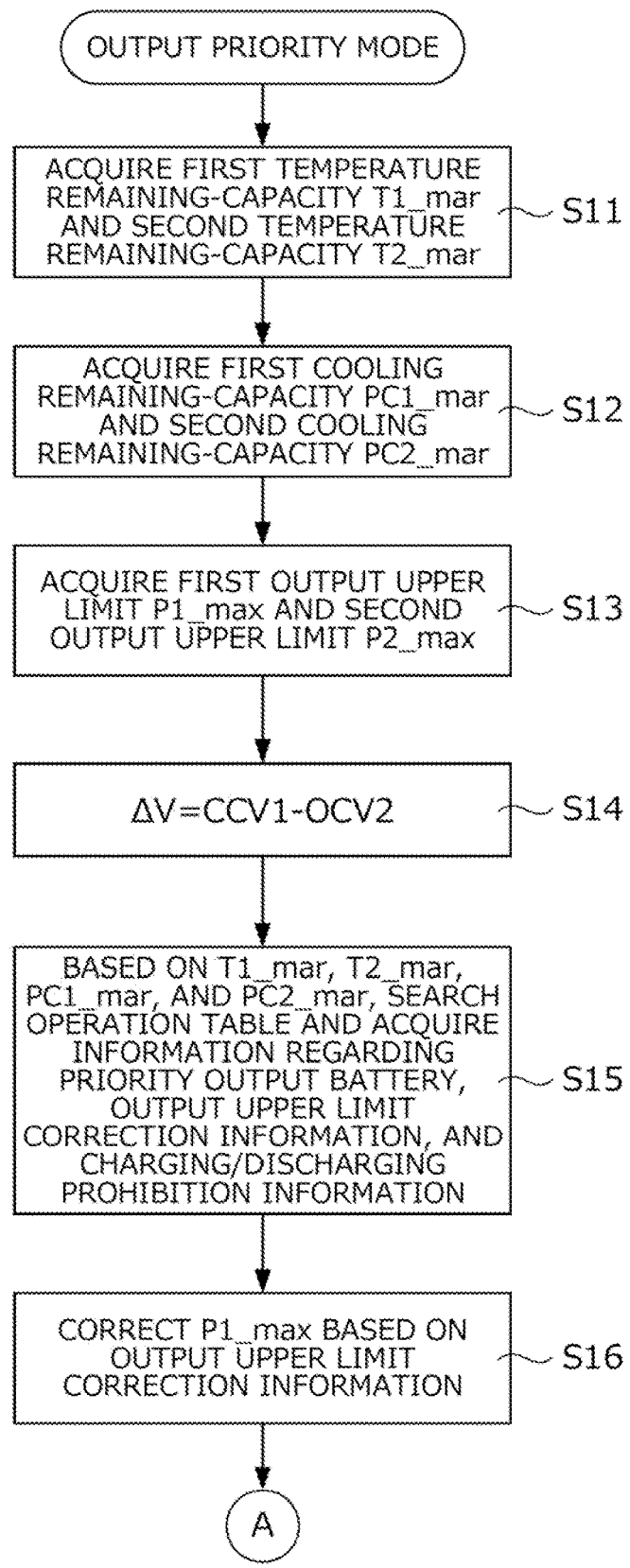
FIG. 6A is a first flowchart showing a procedure for calculating a target converter passing power and a target inverter passing power in an output priority mode.
Figure 6B:
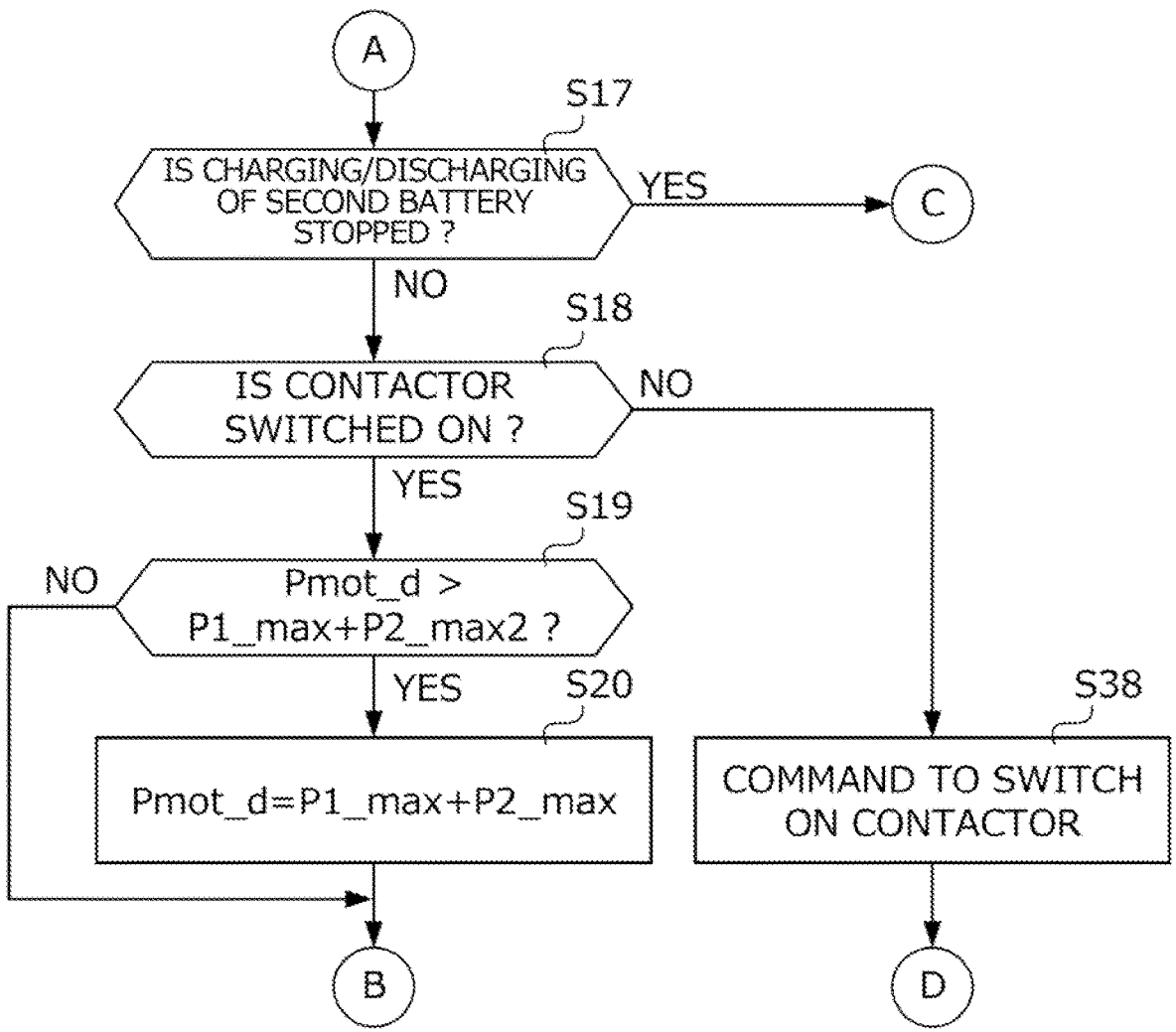
FIG. 6B is a second flowchart showing a procedure for calculating a target converter passing power and a target inverter passing power in an output priority mode.
Figure 6C:
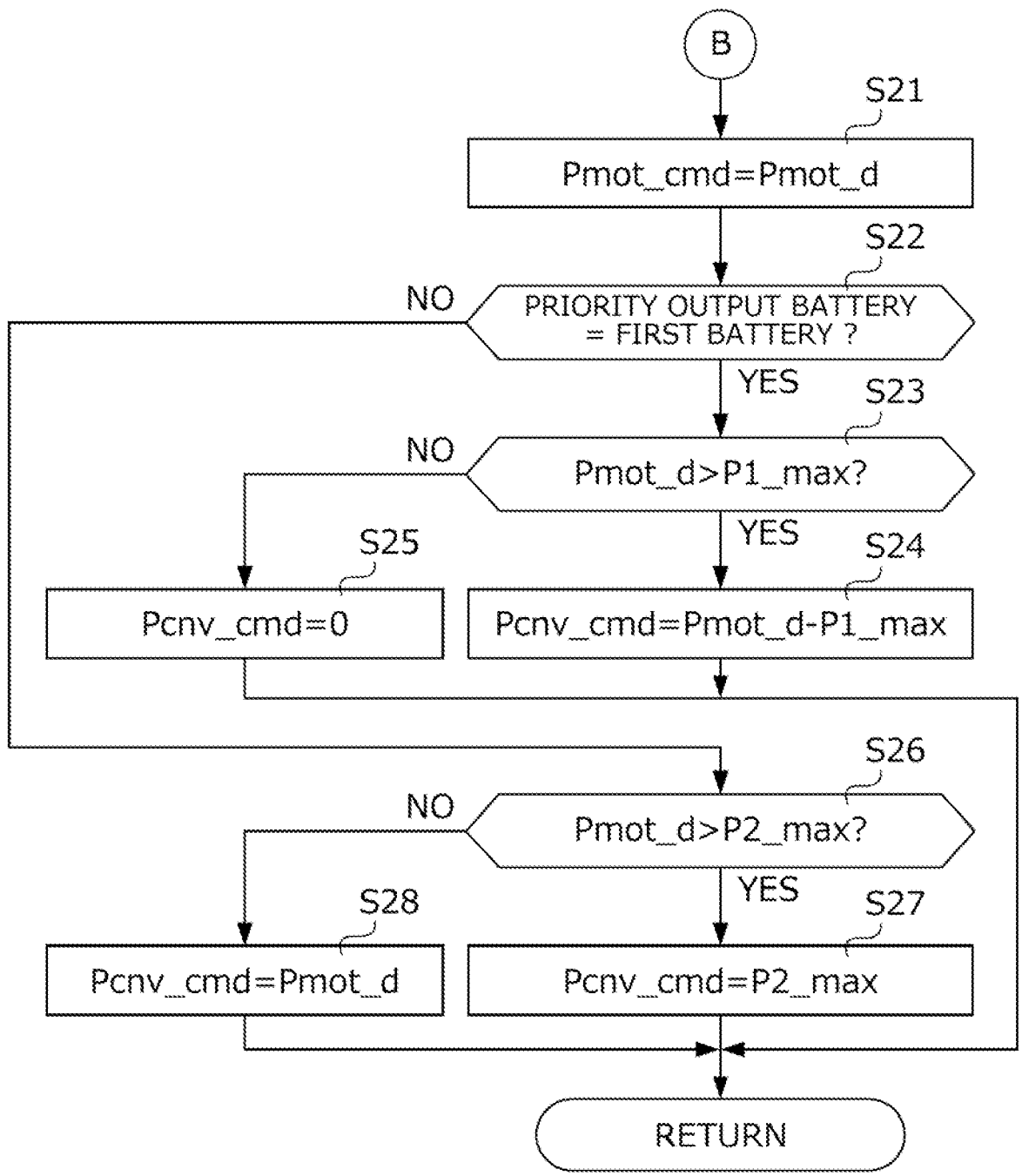
FIG. 6C is a third flowchart showing a procedure for calculating a target converter passing power and a target inverter passing power in an output priority mode.
Figure 6D:
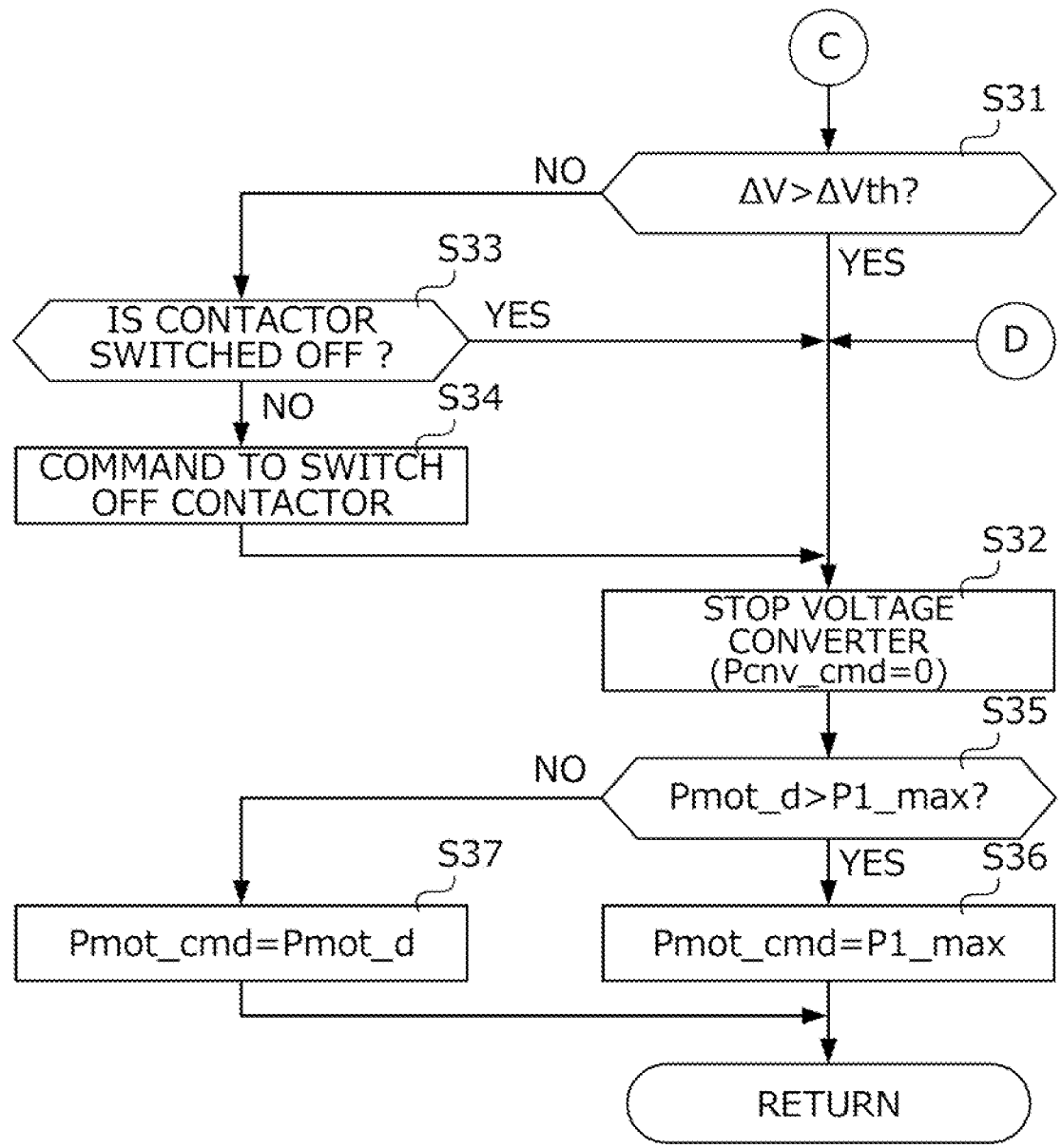
FIG. 6D is a fourth flowchart showing a procedure for calculating a target converter passing power and a target inverter passing power in an output priority mode.

When the determination result in Step S4 is NO, the management ECU 71 proceeds to Step S6. In Step S6, as will be described with reference to FIGS. 6A and 6B, the management ECU 71 calculates the target converter passing power Pcnv_cmd and the target inverter passing power Pmot_cmd in the output priority mode in which the inverter passing power larger than that in the normal mode described above is allowed, and then, proceeds to Step S7.

FIGS. 6A, 6B, 6C, and 6D are flowcharts showing a procedure for calculating the target converter passing power Pcnv_cmd and the target inverter passing power Pmot_cmd in the output priority mode.

First, in Step S11, the management ECU 71 acquires a first temperature remaining-capacity T1_mar and a second temperature remaining-capacity T2_mar from the first battery ECU 74 and the second battery ECU 75, respectively, and then, proceeds to Step S12.

Next, in Step S12, the management ECU 71 acquires a first cooling remaining-capacity PC1_mar and a second cooling remaining-capacity PC2_mar from the cooling circuit ECU 76, and then, proceeds to Step S13.

Next, in Step S13, the management ECU 71 acquires a first output upper limit P1_max and a second output upper limit P2_max from the first battery ECU 74 and the second battery ECU 75, respectively, and then, proceeds to Step S14.

Next, in Step S14, the management ECU 71 acquires a closed circuit voltage CCV1 of the first battery B1 and a static voltage OCV2 of the second battery B2 from the first battery ECU 74 and the second battery ECU 75, respectively, and calculates a potential difference ΔV by subtracting the static voltage OCV2 of the second battery B2 from the closed circuit voltage CCV1 of the first battery B1, and then, proceeds to Step S15.

Next, in Step S15, the management ECU 71 searches an operation table shown in FIG. 7, based on the first temperature remaining-capacity T1_mar, the second temperature remaining-capacity T2_mar, the first cooling remaining-capacity PC1_mar, and the second cooling remaining-capacity PC2_mar which have been acquired, thereby acquiring information regarding the priority output battery, output upper limit correction information, and charging/discharging stop information of the second battery B2, and the management ECU 71 proceeds to Step S16.

FIG. 7 shows an example of the operation table for determining the output and the cooling mode of the battery based on the temperature remaining-capacity and the cooling remaining-capacity.

In FIG. 7, "with the temperature remaining-capacity" means that the first temperature remaining-capacity T1_mar is equal to or more than a predetermined first temperature remaining-capacity threshold value or the second temperature remaining-capacity T2_mar is equal to or more than a predetermined second temperature remaining-capacity threshold value. "No temperature remaining-capacity" means that the first temperature remaining-capacity T1_mar is less than the first temperature remaining-capacity threshold value or the second temperature remaining-capacity T2_mar is less than the second temperature remaining-capacity threshold value. "With the cooling remaining-capacity" means that the first cooling remaining-capacity PC1_mar is equal to or more than the predetermined first cooling remaining-capacity threshold value or the second cooling remaining-capacity PC2_mar is equal to or more than the predetermined second cooling remaining-capacity threshold value. Further, "no cooling remaining-capacity" means that the first cooling remaining-capacity PC1_mar is less than the first cooling remaining-capacity threshold value or the second cooling remaining-capacity PC2_mar is less than the second cooling remaining-capacity threshold value.

Hereinafter, the case where the first temperature remaining-capacity T1_mar is equal to or more than the first temperature remaining-capacity threshold value is also referred to as a case where the first battery B1 has the temperature remaining-capacity, and the case where the first temperature remaining-capacity T1_mar is less than the first temperature remaining-capacity threshold value is also referred to as a case where the first battery B1 has no temperature remaining-capacity. The case where the second temperature remaining-capacity T2_mar is equal to or more than the second temperature remaining-capacity threshold value is also referred to as a case where the second battery B2 has the temperature remaining-capacity, and the case where the second temperature remaining-capacity T2_mar is less than the second temperature remaining-capacity threshold value is also referred to as a case where the second battery B2 has no temperature remaining-capacity. The case where the first cooling remaining-capacity PC1_mar is equal to or more than the first cooling remaining-capacity threshold value is also referred to as a case where the first battery B1 has the cooling remaining-capacity, and the case where the first cooling remaining-capacity PC1_mar is less than the first cooling remaining-capacity threshold value is also referred to as a case where the first battery B1 has no cooling remaining-capacity. In addition, the case where the second cooling remaining-capacity PC2_mar is equal to or more than the second cooling remaining-capacity threshold value is also referred to as a case where the second battery B2 has the cooling remaining-capacity, and the case where the second cooling remaining-capacity PC2_mar is less than the second cooling remaining-capacity threshold value is also referred to as a case where the second battery B2 has no cooling remaining-capacity.

In the operation table shown in FIG. 7, a "charging/discharging stop: second battery" indicates that the charging/discharging of the second battery B2 is temporarily stopped. Therefore, according to the example of the operation table shown in FIG. 7, when the second battery B2 does not have at least one of the temperature remaining-capacity and the cooling remaining-capacity, the charging/discharging of the second battery B2 is stopped.

The priority output battery refers to a battery that preferentially outputs the power up to its output upper limit. As will be described below, when the priority output battery is the first battery B1, the first battery B1 preferentially outputs the power up to the first output upper limit P1_max, and when the priority output battery is the second battery B2, the second battery B2 preferentially outputs the power up to the second output upper limit P2_max.

According to the example of the operation table shown in FIG. 7, when the first battery B1 has the temperature remaining-capacity and the cooling remaining-capacity, the first battery B1 is determined as a priority output battery, and when the second battery B2 has the temperature remaining-capacity and the cooling remaining-capacity, the second battery B2 is basically determined as a priority output battery. Further, when both of the first battery B1 and the second battery B2 have the temperature remaining-capacity and the cooling remaining-capacity, the first battery B1 having a large heat capacity and hardly rising in temperature is determined as a priority output battery. In addition, even when the second battery B2 does not have at least one of the temperature remaining-capacity and the cooling remaining-capacity, that is, when the charging/discharging of the second battery B2 is stopped as described above, the first battery B1 is determined as a priority output battery.

In the operation table shown in FIG. 7, a "first output upper limit: DOWN" indicates that the first output upper limit P1_max of the first battery B1 is corrected downward. Therefore, according to the example of the operation table shown in FIG. 7, when the first battery B1 has neither the temperature remaining-capacity nor the cooling remaining-capacity, the first output upper limit P1_max is corrected downward.

Returning back to FIG. 6A, in Step S16, the management ECU 71 corrects the first output upper limit P1_max based on the output upper limit correction information acquired in Step S15, and then, proceeds to Step S17.

In Step S17, the management ECU 71 determines, based on the charging/discharging stop information of the second battery B2 acquired in Step S15, whether the second battery B2 is in the charging/discharging stop state. When the determination result in Step S17 is NO, the management ECU 71 proceeds to Step S18; when the determination result is YES, the management ECU 71 proceeds to Step S31.

In Step S18, the management ECU 71 determines whether the contactors 32p and 32n of the second battery B2 are currently switched on, that is, the second battery B2 is connected to the second power circuit 3. When the determination result in Step S18 is NO, the management ECU 71 proceeds to Step S19; when the determination result is YES, the management ECU 71 proceeds to Step S38.

Next, in Step S19, the management ECU 71 determines whether the requested inverter passing power Pmot_d acquired in Step S1 is larger than the sum of the first output upper limit P1_max and the second output upper limit P2_max. When the determination result in Step S19 is YES, the management ECU 71 proceeds to Step S20, performs the limit processing for limiting the requested inverter passing power Pmot_d to less than a predetermined value, and then, proceeds to Step S21. In the limit processing of Step S20, the management ECU 71 sets the sum of the first output upper limit P1_max and the second output upper limit P2_max as the requested inverter passing power Pmot_d, for example, thereby limiting the requested inverter passing power Pmot_d. When the determination result in Step S19 is NO, the management ECU 71 proceeds to Step S21, without executing the limit processing described above.

Next, in Step S21, the management ECU 71 sets the requested inverter passing power Pmot_d as the target inverter passing power Pmot_cmd, and then, proceeds to Step S22.

Next, in Step S22, the management ECU 71 determines whether the priority output battery acquired in Step S15 is the first battery B1. When the determination result in Step S22 is YES, the management ECU 71 proceeds to Step S23; when the determination result is NO, the management ECU 71 proceeds to Step S26.

Next, in Step S23, the management ECU 71 determines whether the requested inverter passing power Pmot_d is larger than the first output upper limit P1_max. When the determination result in Step S23 is YES, the management ECU 71 proceeds to Step S24, sets the value obtained by subtracting the first output upper limit P1_max from the requested inverter passing power Pmot_d as the target converter passing power Pcnv_cmd, and then, proceeds to Step S7 in FIG. 5. When the determination result in Step S23 is NO, the management ECU 71 proceeds to Step S25, sets a value of 0 as the target converter passing power Pcnv_cmd, and then, proceeds to Step S7 in FIG. 5. When the first battery B1 is set as the priority output battery as described above, the first battery B1 is given priority over the second battery B2 to output the power up to the first output upper limit P1_max.

Next, in Step S26, the management ECU 71 determines whether the requested inverter passing power Pmot_d is larger than the second output upper limit P2_max. When the determination result in Step S26 is YES, the management ECU 71 proceeds to Step S27, sets the second output upper limit P2_max as the target converter passing power Pcnv_cmd, and then, proceeds to Step S7 in FIG. 5. When the determination result in Step S26 is NO, the management ECU 71 proceeds to Step S28, sets the requested inverter passing power Pmot_d as the target converter passing power Pcnv_cmd, and then, proceeds to Step S7 in FIG. 5. When the second battery B2 is set as the priority output battery as described above, the second battery B2 is given priority over the first battery B1 to output the power up to the second output upper limit P2_max.

When the determination result in Step S17 is YES, the management ECU 71 proceeds to Step S31, and determines whether the potential difference ΔV between the first battery B1 and the second battery B2 calculated in Step S14 is equal to or more than a predetermined potential difference threshold value ΔVth.

When the determination result in Step S31 is YES, that is, when the second battery B2 does not have at least one of the temperature remaining-capacity and the cooling remaining-capacity and the potential difference ΔV is equal to or more than the potential difference threshold value ΔVth, the management ECU 71 proceeds to Step S32. In Step S32, the management ECU 71 sets the value of 0 as the target converter passing power Pcnv_cmd, that is, stops the voltage converter 5, and thereafter, proceeds to Step S35. Thus, the charging/discharging of the second battery B2 is stopped. Further, since the cooling of the second battery B2 is promoted when the charging/discharging of the second battery B2 is stopped, both of the second temperature remaining-capacity T2_mar and the second cooling remaining-capacity PC2_mar gradually increase. In addition, the management ECU 71 stops the voltage converter 5 in Step S32, and sets values other than the value of 0 as a target converter passing power Pcnv_mot such that the driving of the voltage converter 5 is restarted in response to the fact that the second temperature remaining-capacity T2_mar is equal to or more than the second temperature remaining-capacity threshold value and the second cooling remaining-capacity PC2_mar is equal to or more than the second cooling remaining-capacity threshold value (see Steps S24, S27, and S28).

Next, in Step S35, the management ECU 71 determines whether the requested inverter passing power Pmot_d is larger than the first output upper limit P1_max of the first battery B1. When the determination result in Step S35 is YES, the management ECU 71 proceeds to Step S36, sets the first output upper limit P1_max as the target inverter passing power Pmot_cmd, and then, proceeds to Step S7 in FIG. 5. When the determination result in Step S35 is NO, the management ECU 71 sets the requested inverter passing power Pmot_d as the target inverter passing power Pmot_cmd, and then, proceeds to Step S7 in FIG. 5.

When the determination result in Step S31 is NO, that is, when the second battery B2 does not have at least one of the temperature remaining-capacity and the cooling remaining-capacity and the potential difference ΔV is less than the potential difference threshold value ΔVth, the management ECU 71 proceeds to Step S33. In Step S33, the management ECU 71 determines whether the contactors 32p and 32n of the second battery B2 are currently switched off, that is, the second battery B2 is connected to the second power circuit 3. When the determination result in Step S33 is YES, that is, when the second battery B2 has already been shut off from the second power circuit 3, the management ECU 71 proceeds to Step S32. Further, when the determination result in Step S33 is NO, that is, when the second battery B2 has not yet been shut off from the second power circuit 3, the management ECU 71 proceeds to Step S34, transmits a command to switch off the contactors 32p and 32n of the second battery B2 to the second battery ECU 75, and then, proceeds to Step S32. The second battery ECU 75 switches off the contactors 32p and 32n in response to the reception of the command, and shuts off the second battery B2 from the second power circuit 3. Thus, the charging/discharging of the second battery B2 is stopped. In addition, the charging/discharging of the second battery B2 is stopped when the charging/discharging of the second battery B2 is stopped. Further, since the cooling of the second battery B2 is promoted when the charging/discharging of the second battery B2 is stopped, both of the second temperature remaining-capacity T2_mar and the second cooling remaining-capacity PC2_mar gradually increase.

In Step S38, the management ECU 71 transmits a command to switch on the contactors 32p and 32n of the second battery B2 to the second battery ECU 75, and then, proceeds to Step S32. In other words, the management ECU 71 shuts off the second battery B2 from the second power circuit 3 based on the command in Step S34, switches on the contactors 32p and 32n in response to the fact that the second temperature remaining-capacity T2_mar becomes equal to or more than the second temperature remaining-capacity threshold value and the second cooling remaining-capacity PC2_mar becomes equal to or more than the second cooling remaining-capacity threshold value, and then connects the second battery B2 to the second power circuit 3. In Step S38, after the command to switch on the contactors 32p and 32n is transmitted to the second battery ECU 75, until the contactors 32p and 32n are actually switched on (that is, until the determination result in Step S18 becomes YES), the vehicle travels only by the output power from the first battery B1 (see Steps S35 to S37).

As described above, when an operation mode is the output priority mode, the management ECU 71 controls the output power of the first battery B1 and the output power of the second battery B2 based on the requested inverter passing power Pmot_d, the first cooling remaining-capacity PC1_mar, the second cooling remaining-capacity PC2_mar, the first temperature remaining-capacity T1_mar, and the second temperature remaining-capacity T2_mar.

Returning back to FIG. 4, a procedure for controlling the first cooling output and the second cooling output by the cooling circuit ECU 76 will be described.

As described with reference to FIG. 5, when the operation mode in the power management processing is the output priority mode (see Step S6 in FIG. 5), the larger inverter passing power is allowed compared with when the operation mode is the normal mode (see Step S3 in FIG. 5). For this reason, the amount of heat generated by the first battery B1 and the second battery B2 tends to be larger when the operation mode is the output priority mode than when the operation mode is the normal mode. For this reason, the cooling circuit ECU 76 changes the control algorithms of the first cooling output and the second cooling output according to the operation mode in the power management processing.

First, a case where the operation mode is the normal mode will be described. When the operation mode is the normal mode, the cooling circuit ECU 76 calculates a first control input (for example, a duty ratio of the motor for driving the radiator fan) to the first cooler 91, based on a known first basic cooling algorithm using the first battery temperature transmitted from the first battery ECU 74, the detection value of the first cooling water temperature sensor, and the detection value of the outside air temperature sensor, such that the first battery temperature is at the predetermined first target temperature, and controls the first cooling output by inputting the first control input to the first cooler 91.

In addition, when the operation mode is the normal mode, the cooling circuit ECU 76 calculates a second control input (for example, a duty ratio of the motor for driving the cooling fan) to the second cooler 92, based on a known second basic cooling algorithm using the second battery temperature transmitted from the second battery ECU 75 and the detection value of the outside air temperature sensor, such that the second battery temperature is at the predetermined second target temperature, and controls the second cooling output by inputting the second control input to the second cooler 92.

Next, a case where the operation mode is the output priority mode will be described. When the operation mode is the output priority mode, the cooling circuit ECU 76 controls the first cooling output based on the first basic cooling algorithm, the first temperature remaining-capacity T1_mar, and the first cooling remaining-capacity PC1_mar which are described above. More specifically, first, the cooling circuit ECU 76 searches an operation map shown in FIG. 7 based on the first temperature remaining-capacity T1_mar and the first cooling remaining-capacity PC1_mar, thereby acquiring information regarding a first cooling mode of the first battery B1. According to the example of the operation map shown in FIG. 7, when the first battery B1 has the cooling remaining-capacity, the first cooling mode is "active cooling". Further, when the first battery B1 has no cooling remaining-capacity, the first cooling mode is "cooling max".

Next, the cooling circuit ECU 76 corrects the first control input calculated based on the first basic cooling algorithm described above according to the first cooling mode information acquired from the operation map in FIG. 7, and controls the first cooling output by inputting the corrected first control input to the first cooler 91. When the first cooling mode is the "active cooling", the cooling circuit ECU 76 adds the correction value calculated based on the first temperature remaining-capacity T1_mar to the first control input calculated based on the first basic cooling algorithm, thereby correcting the first control input to cooling performance improvement. Therefore, when the operation mode is the output priority mode and the first cooling mode is the "active cooling", the cooling circuit ECU 76 increases the first cooling output compared with the case where the operation mode is the normal mode. Further, when the first cooling mode is the "cooling max", the cooling circuit ECU 76 sets the first control input as the maximum value regardless of the calculation result of the first control input based on the first basic cooling algorithm. Therefore, when the operation mode is the output priority mode and the first cooling mode is the "cooling max", the cooling circuit ECU 76 increases the first cooling output to the first maximum cooling output.

Further, when the operation mode is the output priority mode, the cooling circuit ECU 76 controls the second cooling output based on the second basic cooling algorithm, the second temperature remaining-capacity T2_mar, and the second cooling remaining-capacity PC2_mar which are described above. More specifically, first, the cooling circuit ECU 76 searches the operation map shown in FIG. 7 based on the second temperature remaining-capacity T2_mar and the second cooling remaining-capacity PC2_mar, thereby acquiring the information regarding the second cooling mode of the second battery B2. According to the example of the operation map shown in FIG. 7, when the second battery B2 has the cooling remaining-capacity, the second cooling mode is the "active cooling". Further, when the second battery B2 has no cooling remaining-capacity, the second cooling mode is the "cooling max".

Next, cooling circuit ECU 76 corrects the second control input calculated based on the second basic cooling algorithm described above according to the second cooling mode information acquired from the operation map shown in FIG. 7, and controls the second cooling output by inputting the corrected second control input to the second cooler 92. When the second cooling mode is the "active cooling", the cooling circuit ECU 76 adds the correction value calculated based on the second temperature remaining-capacity T2_mar to the second control input calculated based on the second basic cooling algorithm, thereby correcting the second control input to the cooling performance improvement. Therefore, when the operation mode is the output priority mode and the second cooling mode is the "active cooling", the cooling circuit ECU 76 increases the second cooling output compared with the case where the operation mode is the normal mode. Further, when the second cooling mode is the "cooling max", the cooling circuit ECU 76 sets the second control input as the maximum value regardless of the calculation result of the second control input based on the second basic cooling algorithm. Therefore, when the operation mode is the output priority mode and the second cooling mode is the "cooling max", the cooling circuit ECU 76 increases the second cooling output to the second maximum cooling output.

The power supply system 1 according to the present embodiment exerts the following effects.

(1) In the power supply system 1, the first power circuit 2 including the first battery B1 is connected, via the voltage converter 5, to the second power circuit 3 including the second battery B2, which has an operating voltage range relative to the closed circuit voltage that overlaps that of the first battery B1 and which has a lower static voltage than the first battery B1, and the first power circuit 2 is connected to the drive motor M via the power converter 43. The management ECU 71 acquires the potential difference $\Delta V$ between the closed circuit voltage CCV1 of the first battery B1 and the static voltage OCV2 of the second battery B2, the second temperature remaining-capacity T2_mar of the second battery B2, and the second cooling remaining-capacity PC2_mar of the second battery B2. Further, the management ECU 71 stops the voltage converter 5 in the case where at least one of the second temperature remaining-capacity T2_mar and the second cooling remaining-capacity PC2_mar is less than the associated one of the threshold value for the temperature remaining-capacity and the threshold value for the cooling remaining-capacity, and the potential difference $\Delta V$ is equal to or more than the potential difference threshold value $\Delta Vth$. Here, stopping the voltage converter 5 makes it possible to prevent the electrical current from flowing into at least the second battery B2, whereby the temperature of the second battery B2 can be reduced thereafter. Therefore, the power supply system 1 makes it possible to prevent unintended charging/discharging of the second battery B2 being in a high temperature state. In particular, the power supply system 1 determines the timing at which the voltage converter 5 is stopped in consideration of not only the second temperature remaining-capacity T2_mar but also the second cooling remaining-capacity PC2_mar, and thus can stop the voltage converter 5 at an appropriate timing in consideration of the cooling performance provided on the second battery B2 by the second cooler 92. In the power supply system 1, when the potential difference $\Delta V$ is equal to or more than the potential difference threshold value $\Delta Vth$, only the voltage converter 5 is stopped, thereby making it possible to quickly charge and discharge the second battery B2 as necessary.

(2) After stopping the voltage converter 5, the management ECU 71 restarts driving the voltage converter 5 in response to the second temperature remaining-capacity T2_mar and the second cooling remaining-capacity PC2_mar both becoming equal to or more than the threshold values. This feature makes it possible to prevent unintended charging/discharging of the second battery B2 being in a high temperature state.

(3) In the case where at least one of the second temperature remaining-capacity T2_mar and the second cooling remaining-capacity PC2_mar is less than the associated one of the threshold value for the temperature remaining-capacity and the threshold value for the cooling remaining-capacity, and the potential difference $\Delta V$ is less than the potential difference threshold value $\Delta Vth$, the management ECU 71 shuts off the second battery B2 from the second power circuit 3. Here, when the second battery B2 is shut off from the second power circuit 3, the charging/discharging of the second battery B2 can be reliably prevented, whereby the temperature of the second battery B2 can be reduced thereafter. Therefore, the power supply system 1 makes it possible to prevent unintended charging/discharging of the second battery B2 being in a high temperature state. In particular, the power supply system 1 determines the timing at which the second battery B2 is shut off from the second power circuit 3 in consideration of not only the second temperature remaining-capacity T2_mar but also the second cooling remaining-capacity PC2_mar, and thus can shut off the second battery B2 from the second power circuit 3 at an appropriate timing in consideration of the cooling performance provided on the second battery B2 by the second cooler 92.

(4) After shutting off the second battery B2 from the second power circuit 3, the management ECU 71 connects the second battery B2 to the second power circuit 3 in response to the second temperature remaining-capacity T2_mar and the second cooling remaining-capacity PC2_mar both becoming are equal to or more than the threshold values. This feature makes it possible to more reliably prevent unintended charging/discharging from the second battery B2 being in a high temperature state.

(5) In a case where the operation mode in the management processing is the output priority mode and the second cooling remaining-capacity PC2_mar is equal to or more than the second cooling remaining-capacity threshold value, the cooling circuit ECU 76 increases the second cooling output compared with the case where the operation mode is the normal mode. Thus, since the second temperature remaining-capacity T2_mar can be increased quickly, the chances of charging and discharging the second battery B2 in the output priority mode can be increased.

Although an embodiment of the present invention has been described above, the present invention is not limited thereto. The configurations of detailed parts may be modified as appropriate within the scope of the gist of the present invention.

What is claimed is:

1. A power supply system comprising:
    a first power circuit including a first electrical storage device;
    a second power circuit including a second electrical storage device having an operating voltage range which overlaps that of the first electrical storage device relative to a closed circuit voltage, the second electrical storage device having a static voltage which is lower than that of the first electrical storage device;
    a voltage converter that converts a voltage between the first power circuit and the second power circuit;
    a power converter that converts power between the first power circuit and a rotary electrical machine;
    a power controller that operates the voltage converter and the power converter to control charging and discharging of the first and second electrical storage devices;
    a potential difference acquirer that acquires a potential difference between the first electrical storage device and the second electrical storage device;
    a cooler that cools the second electrical storage device;
    a cooling output controller that controls cooling output by the cooler; and
    a temperature acquirer that acquires a temperature of the second electrical storage device, the power supply system further comprising:
    a temperature remaining-capacity acquirer that acquires a temperature remaining-capacity increasing or decreasing depending on a difference between an upper limit temperature of the second electrical storage device and the temperature of the second electrical storage device; and a cooling remaining-capacity acquirer that acquires a cooling remaining-capacity increasing or decreasing depending on a difference between maximum cooling output and the cooling output of the cooler, the power controller being configured to stop the voltage converter in a case where at least one of the temperature remaining-capacity and the cooling remaining-capacity is less than an associated one of a threshold value for the temperature remaining-capacity and a threshold value for the cooling remaining-capacity and the potential difference is equal to or more than a potential difference threshold value.

2. The power supply system according to claim 1, wherein after stopping the voltage converter, the power controller starts driving the voltage converter in response to the temperature remaining-capacity and the cooling remaining-capacity both becoming equal to or more than the threshold values.

3. The power supply system according to claim 2, wherein the power controller shuts off the second electrical storage device from the second power circuit in a case where at least one of the temperature remaining-capacity and the cooling remaining-capacity is less than the associated one of the threshold value for the temperature remaining-capacity and the threshold value for the cooling remaining-capacity and the potential difference is less than the potential difference threshold value.

4. The power supply system according to claim 3, wherein the power controller controls the charging and discharging of the first and second electrical storage devices in a normal mode or an output priority mode that allows output, which is larger than that in the normal mode, from the first power circuit to the rotary electrical machine, and wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

5. The power supply system according to claim 2, wherein the power controller controls the charging and discharging of the first and second electrical storage devices in a normal mode or an output priority mode that allows output, which is larger than that in the normal mode, from the first power circuit to the rotary electrical machine, and wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

6. The power supply system according to claim 1, wherein the power controller shuts off the second electrical storage device from the second power circuit in a case where at least one of the temperature remaining-capacity and the cooling remaining-capacity is less than the associated one of the threshold value for the temperature remaining-capacity and the threshold value for the cooling remaining-capacity and the potential difference is less than the potential difference threshold value.

7. The power supply system according to claim 6, wherein the power controller controls the charging and discharging of the first and second electrical storage devices in a normal mode or an output priority mode that allows output, which is larger than that in the normal mode, from the first power circuit to the rotary electrical machine, and wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

8. The power supply system according to claim 1, wherein the power controller controls the charging and discharging of the first and second electrical storage devices in a normal mode or an output priority mode that allows output, which is larger than that in the normal mode, from the first power circuit to the rotary electrical machine, and wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

9. A power supply system comprising:
a first power circuit including a first electrical storage device;
a second power circuit including a second electrical storage device having an operating voltage range which overlaps that of the first electrical storage device relative to a closed circuit voltage, the second electrical storage device having a static voltage which is lower than that of the first electrical storage device;
a voltage converter that converts a voltage between the first power circuit and the second power circuit;
a power converter that converts power between the first power circuit and a rotary electrical machine for generating a propulsive force;
a power controller that operates the voltage converter and the power converter to control charging and discharging of the first and second electrical storage devices;
a potential difference acquirer that acquires a potential difference between the first electrical storage device and the second electrical storage device;
a cooler that cools the second electrical storage device;
a cooling output controller that controls cooling output by the cooler; and
a temperature acquirer that acquires a temperature of the second electrical storage device, the power supply system further comprising:
a temperature remaining-capacity acquirer that acquires a temperature remaining-capacity increasing or decreasing depending on a difference between an upper limit temperature of the second electrical storage device and the temperature of the second electrical storage device; and
a cooling remaining-capacity acquirer that acquires a cooling remaining-capacity increasing or decreasing depending on a difference between maximum cooling output and the cooling output of the cooler, the power controller being configured to shut off the second electrical storage device from the second power circuit in a case where at least one of the temperature remaining-capacity and the cooling remaining-capacity is less than an associated one of a threshold value for the temperature remaining-capacity and a threshold value for the cooling remaining-capacity and the potential difference is less than the potential difference threshold value.

10. The power supply system according to claim 9, wherein after shutting off the second electrical storage device from the second power circuit, the power controller connects the second electrical storage device to the second power circuit in response to the temperature remaining-capacity and the cooling remaining-capacity both becoming equal to or more than the threshold values.

11. The power supply system according to claim 10, wherein the power controller stops the voltage converter in a case where at least one of the temperature remaining-capacity and the cooling remaining-capacity is less than the associated one of the threshold value for the temperature remaining-capacity and the threshold value for the cooling remaining-capacity and the potential difference is equal to or more than the potential difference threshold value.

12. The power supply system according to claim 11, wherein the power controller controls the charging and discharging of the first and second electrical storage devices in a normal mode or an output priority mode that allows output, which is larger than that in the normal mode, from the first power circuit to the rotary electrical machine, and
wherein the cooling output controller increases the cooling output in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

13. The power supply system according to claim 6, wherein the power controller controls the charging and discharging of the first and second electrical storage devices in a normal mode or an output priority mode that allows output, which is larger than that in the normal mode, from the first power circuit to the rotary electrical machine, and
wherein the cooling output controller increases the cooling output in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

14. The power supply system according to claim 9, wherein the power controller stops the voltage converter in a case where at least one of the temperature remaining-capacity and the cooling remaining-capacity is less than the associated one of the threshold value for the temperature remaining-capacity and the threshold value for the cooling remaining-capacity and the potential difference is equal to or more than the potential difference threshold value.

15. The power supply system according to claim 14, wherein the power controller controls the charging and discharging of the first and second electrical storage devices in a normal mode or an output priority mode that allows output, which is larger than that in the normal mode, from the first power circuit to the rotary electrical machine, and
wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

16. The power supply system according to claim 9, wherein the power controller controls the charging and discharging of the first and second electrical storage devices in a normal mode or an output priority mode that allows output, which is larger than that in the normal mode, from the first power circuit to the rotary electrical machine, and
wherein in a case where an operation mode of the power controller is the output priority mode and the cooling remaining-capacity is equal to or more than a cooling remaining-capacity threshold value, the cooling output controller increases the cooling output as compared with a case where the operation mode is the normal mode.

* * * * *